(12) United States Patent
Hu

(10) Patent No.: US 12,148,688 B2
(45) Date of Patent: Nov. 19, 2024

(54) SEMICONDUCTOR SUBSTRATE AND MANUFACTURING METHOD THEREOF

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 18/432,092

(22) Filed: Feb. 5, 2024

(65) Prior Publication Data

US 2024/0274520 A1 Aug. 15, 2024

Related U.S. Application Data

(60) Provisional application No. 63/589,964, filed on Oct. 12, 2023, provisional application No. 63/542,090, filed on Oct. 3, 2023, provisional application No. 63/445,264, filed on Feb. 13, 2023.

(30) Foreign Application Priority Data

Oct. 25, 2023 (TW) .................. 112140803

(51) Int. Cl.
*H01L 23/498* (2006.01)
*H01L 21/48* (2006.01)
*H01L 23/00* (2006.01)

(52) U.S. Cl.
CPC .... *H01L 23/49833* (2013.01); *H01L 21/4857* (2013.01); *H01L 21/486* (2013.01); *H01L 23/49822* (2013.01); H01L 21/4853 (2013.01); H01L 24/16 (2013.01); H01L 24/32 (2013.01); H01L 24/73 (2013.01);
(Continued)

(58) Field of Classification Search
CPC ......... H01L 23/485; H01L 23/522–535; H01L 23/5383; H01L 23/5385–5386; H01L 24/18–25; H01L 24/82; H01L 21/4846–4857; H01L 23/49822
See application file for complete search history.

(56) References Cited

U.S. PATENT DOCUMENTS

2014/0225275 A1* 8/2014 Shimizu ............ H01L 23/49827 257/774
2015/0245473 A1* 8/2015 Shimizu ................. H05K 1/113 29/850
2016/0126173 A1 5/2016 Kim et al.
(Continued)

FOREIGN PATENT DOCUMENTS

TW 200303164 8/2003
TW 200507218 2/2005
(Continued)

OTHER PUBLICATIONS

"Office Action of Taiwan Counterpart Application", issued on May 27, 2024, p. 1-p. 14.

*Primary Examiner* — Evan G Clinton
(74) *Attorney, Agent, or Firm* — JCIPRNET

(57) ABSTRACT

A semiconductor substrate includes a first circuit structure and a second circuit structure. The first circuit structure includes a first circuit layer. The first circuit layer includes a first dielectric layer. The second circuit structure includes a second circuit layer. The second circuit layer includes a second dielectric layer. The second circuit structure is disposed on the first circuit structure and is electrically connected to the first circuit structure to constitute the semiconductor substrate. A manufacturing method of the semiconductor substrate is also provided.

27 Claims, 25 Drawing Sheets

(52) U.S. Cl.
CPC ............... *H01L 2224/16227* (2013.01); *H01L 2224/32225* (2013.01); *H01L 2224/73204* (2013.01)

(56) References Cited

U.S. PATENT DOCUMENTS

| | | | |
|---|---|---|---|
| 2018/0308779 A1 | 10/2018 | Tsao et al. | |
| 2020/0027837 A1* | 1/2020 | Jeng | H01L 21/4853 |
| 2020/0146192 A1* | 5/2020 | Lin | H05K 13/0486 |
| 2020/0411442 A1* | 12/2020 | Hu | H01L 23/5385 |
| 2021/0242117 A1* | 8/2021 | Hung | H01L 21/6835 |
| 2022/0108935 A1* | 4/2022 | Cho | H01L 23/49822 |
| 2022/0320027 A1* | 10/2022 | Ko | H01L 23/13 |

FOREIGN PATENT DOCUMENTS

| | | |
|---|---|---|
| TW | 200810065 | 2/2008 |
| TW | 202023011 | 6/2020 |
| TW | 202042363 | 11/2020 |
| TW | 202119603 | 5/2021 |
| TW | 202238899 | 10/2022 |
| TW | 202301489 | 1/2023 |
| WO | 2021246467 | 12/2021 |

\* cited by examiner

SEMICONDUCTOR SUBSTRATE AND MANUFACTURING METHOD THEREOF

CROSS-REFERENCE TO RELATED APPLICATION

This application claims the priority benefit of the U.S. provisional application Ser. No. 63/445,264, filed on Feb. 13, 2023, the priority benefit of the U.S. provisional application Ser. No. 63/542,090, filed on Oct. 3, 2023, the priority benefit of the U.S. provisional application Ser. No. 63/589,964, filed on Oct. 12, 2023, and the priority benefit of Taiwan application serial no. 112140803, filed on Oct. 25, 2023. The entirety of each of the above-mentioned patent applications is hereby incorporated by reference herein and made a part of this specification.

BACKGROUND

Technical Field

The disclosure is related to a semiconductor substrate and manufacturing method thereof.

Description of Related Art

Generally speaking, in order to meet product requirements, a semiconductor substrate often needs to use a multi-layer circuit structure, however, when materials in the multi-layer circuit structure are different, it is easy to cause a situation of a coefficient of thermal expansion (CTE) mismatch, and as the number of layers increases, stress will also accumulate. Therefore, during the process which the inner layers are sequentially formed in the substrate (at least four layers are formed continuously), it is easy to cause warpage problems of the semiconductor substrate, and the more layers there are, the warpage problems will be more obvious. As a result, it will have adverse effects on the yields and the electrical performance in subsequent applications of the semiconductor substrate (such as causing the failure of solder of a subsequent chip bonded thereon).

SUMMARY

The disclosure provides a semiconductor substrate that can maintain better yields and improve the electrical performance in subsequent applications while having a multi-layer circuit structure.

A semiconductor substrate of the disclosure includes a first circuit structure and a second circuit structure. The first circuit structure includes a first circuit layer. The first circuit layer includes a first dielectric layer. The second circuit structure includes a second circuit layer. The second circuit layer includes a second dielectric layer. The second circuit structure is disposed on the first circuit structure and is electrically connected to the first circuit structure to constitute a semiconductor substrate.

An electronic package of the disclosure includes the semiconductor substrate and at least one chip disposed on the semiconductor substrate.

A manufacturing method of a semiconductor substrate of the disclosure includes at least the following steps. The first circuit structure is formed on the first carrier, wherein the first circuit structure includes a first circuit layer, and the first circuit layer includes a plurality of first conductive patterns and a first dielectric layer; the second circuit structure is formed on the second carrier, wherein the second circuit structure includes a second circuit layer, the second circuit layer includes a plurality of second conductive patterns and a second dielectric layer. One of the first carrier and the second carrier is a temporary carrier, and the other of the first carrier and the second carrier is a temporary carrier or permanent carrier. The first circuit structure and the second circuit structure are bonded, such that the first circuit structure and the second circuit structure electrically connect to each other to constitute the semiconductor substrate.

Based on the above, in the disclosure, a plurality of circuit structures are first manufactured separately, and then assembles the aforementioned circuit structures into a semiconductor substrate, such that compared with the production for single process sequentially of the semiconductor substrate, the degree of warpage can be effectively reduced, allowing the semiconductor substrate to maintain better yields and improve the electrical performance in subsequent applications while having a multi-layer circuit structure.

In order to make the above-mentioned features and advantages of the disclosure comprehensible, embodiments accompanied with drawings are described in detail below.

DESCRIPTION OF THE EMBODIMENTS

Figure 1A:
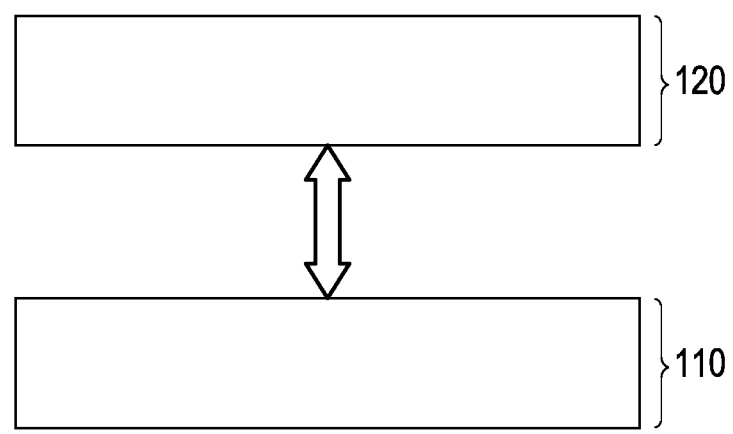
FIG. 1A is a schematic assembly view illustrating a semiconductor substrate according to some embodiments of the disclosure.

Exemplary embodiments of the disclosure are described below comprehensively with reference to the figures, but the disclosure may also be implemented in different ways and should not be construed as limited to the embodiments described herein. In the drawings, for the sake of clarity, the size and thickness of various regions, parts, and layers may not be drawn to actual scale. In order to facilitate understanding, the same elements in the following description are described with the same symbols.

The disclosure is more comprehensively described with reference to the figures of this embodiment. However, the disclosure may also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

Directional terms (for example, upper, lower, right, left, front, back, top, and bottom) used herein only refer to the graphical use, and are not intended to imply absolute orientation.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion.

Unless otherwise defined, all terms (including technical and scientific terms) used herein have the same meaning as that commonly understood by one of ordinary skill in the art to which this disclosure belongs.

Unless otherwise stated, the term "range from" used in the specification to define a value range is intended to cover a range equal to and between the stated endpoint values. For example, a size range ranges from a first value to a second value means that the size range may cover the first value, the second value, and any value between the first value and the second value.

Figure 2A:
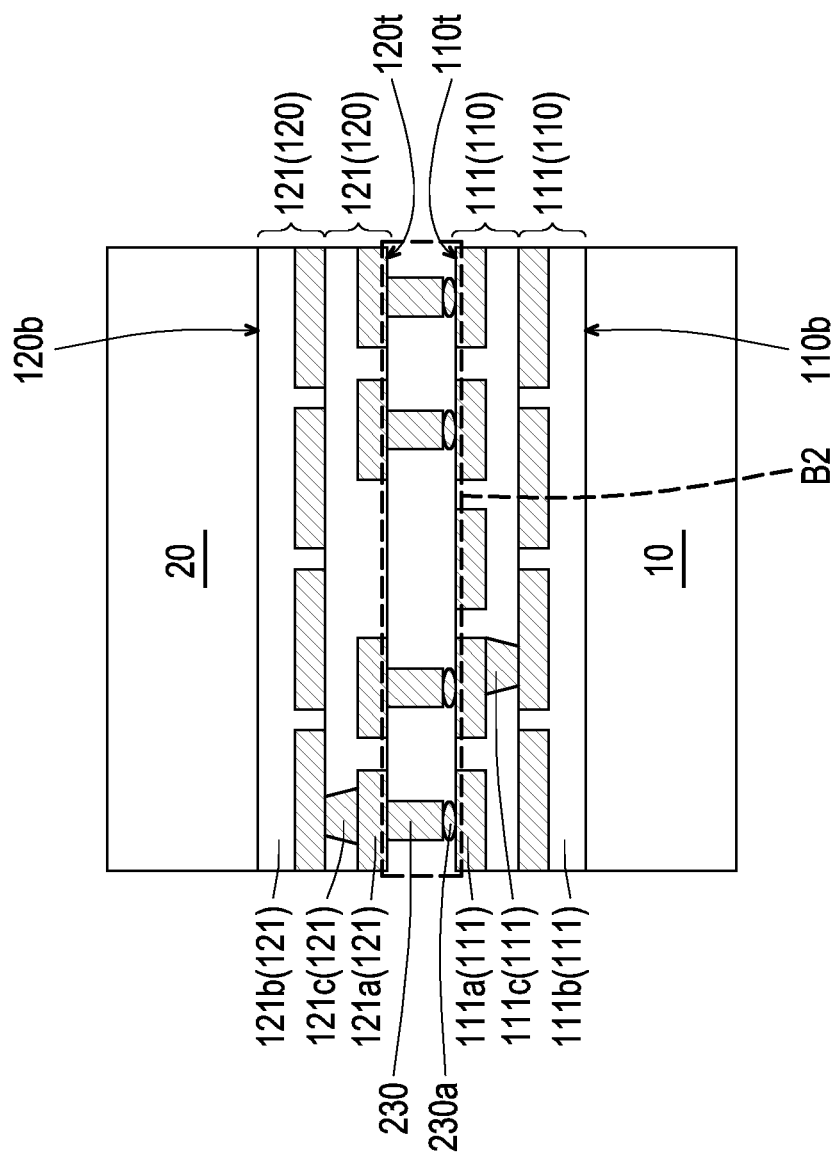
FIG. 2A and FIG. 3 are partial schematic cross-sectional views illustrating alternative embodiments of the structure of FIG. 1D.
Figure 2B:
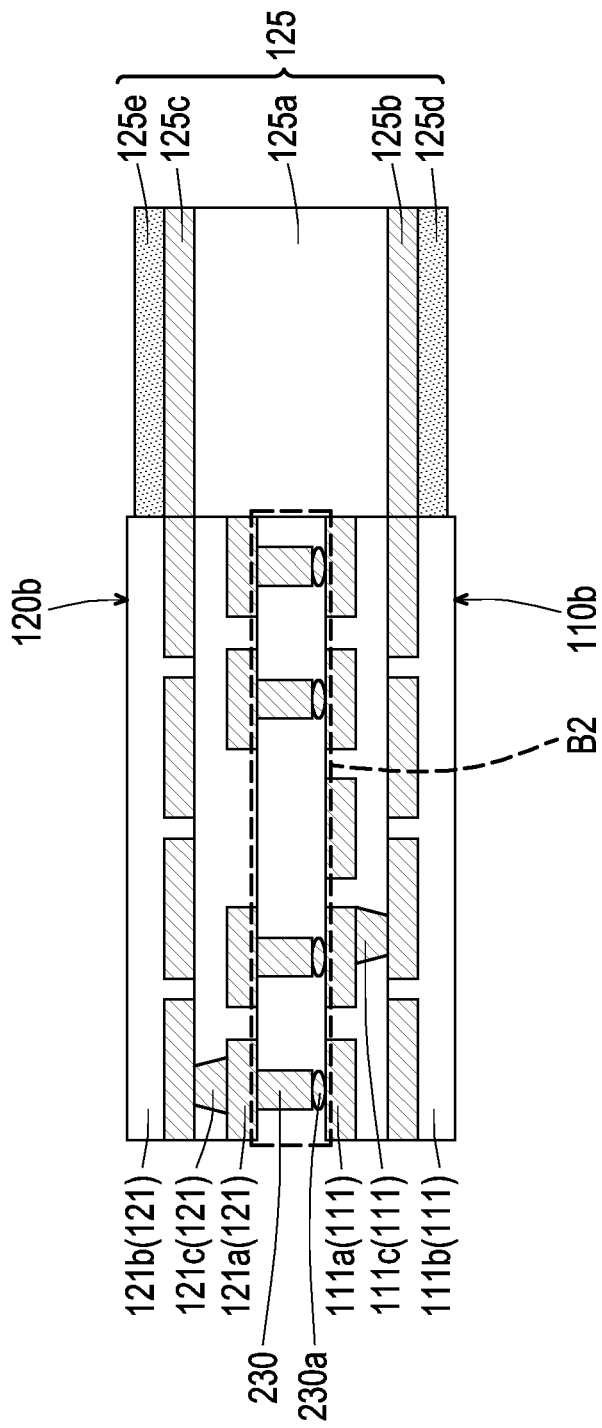
FIG. 2B is a partial schematic cross-sectional view illustrating an electronic package including of a semiconductor substrate of some embodiments of the disclosure.
Figure 2C:
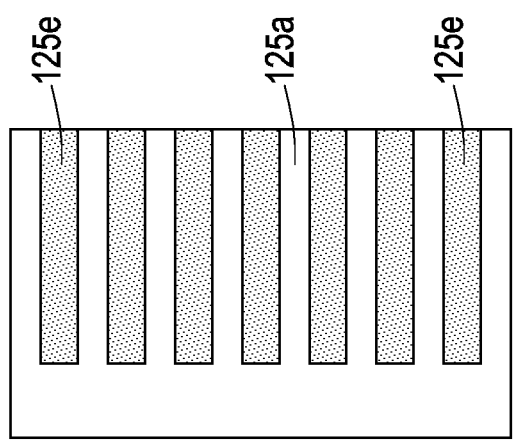
FIG. 2C is a partial schematic top view of the structure of FIG. 2B.
Figure 3:
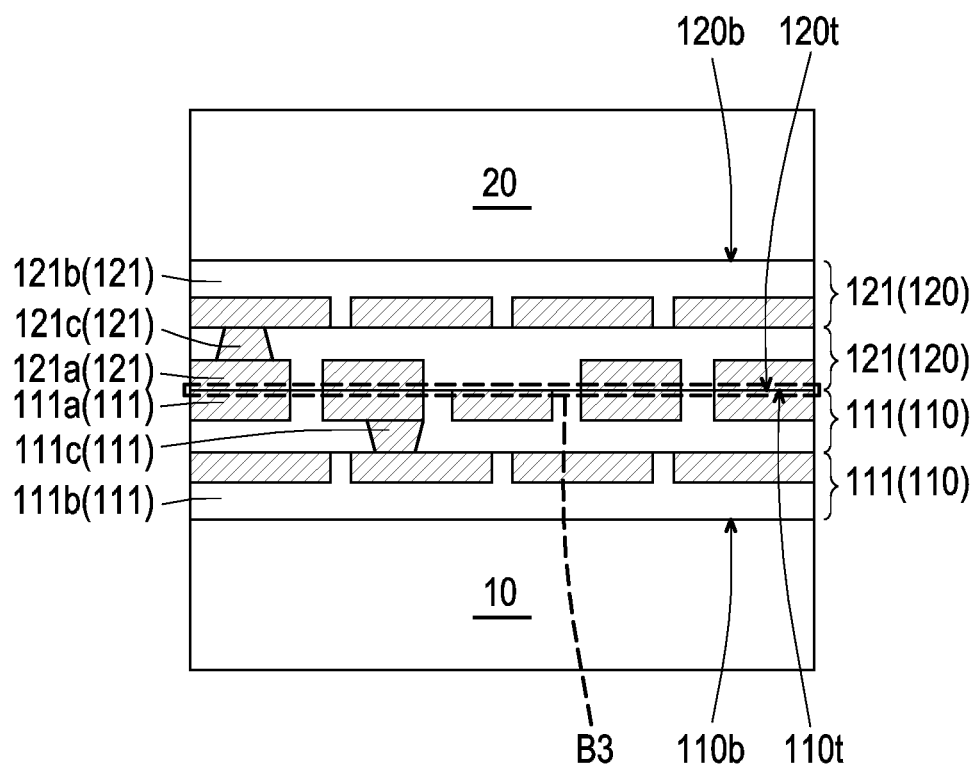

FIG. 1A is a schematic assembly view illustrating a semiconductor substrate according to some embodiments of the disclosure. FIG. 1B to FIG. 1E are partial schematic cross-sectional views illustrating a manufacturing method of a semiconductor substrate according to some embodiments of the disclosure. FIG. 1F is a schematic view illustrating a bond of a semiconductor substrate according to some embodiments of the disclosure. FIG. 1G and FIG. 1H are partial schematic cross-sectional views illustrating an electronic package including of a semiconductor substrate of some embodiments of the disclosure. FIG. 2A and FIG. 3 are partial schematic cross-sectional views illustrating alternative embodiments of the structure of FIG. 1D. FIG. 2B is a partial schematic cross-sectional view illustrating an electronic package including of a semiconductor substrate of some embodiments of the disclosure. FIG. 2C is a partial schematic top view of the structure of FIG. 2B.

Figure 1B:
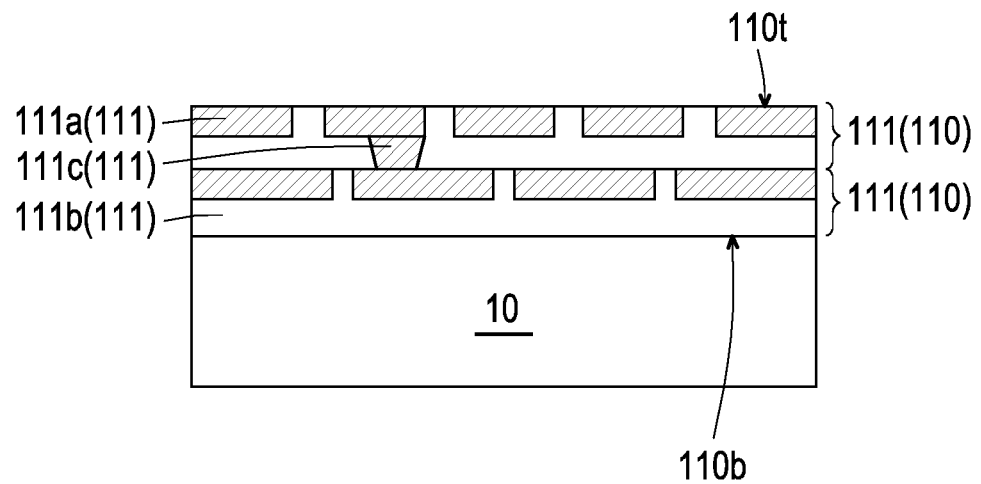
FIG. 1B to FIG. 1E are partial schematic cross-sectional views illustrating a manufacturing method of a semiconductor substrate according to some embodiments of the disclosure.

Referring to FIG. 1A and FIG. 1B. A first circuit structure 110 including a plurality of first circuit layers 111 (FIG. 1B schematically illustrates two first circuit layers 111) is formed on a first carrier 10, wherein the first carrier 10 may be a temporary carrier made of glass, plastic, silicon, metal, or other suitable materials in the embodiment. Therefore, the first carrier 10 may only have a carrying function but not have a wiring function, and active devices and/or passive devices not include therein, but the disclosure is not limited thereto. In here, the first circuit structure 110 includes a top surface 110t and a bottom surface 110b which are opposite to each other, and the bottom surface 110b is closer to the first carrier 10 than the top surface 110t.

In the embodiment, since the first carrier 10 is a temporary carrier, a release layer (such as a photothermal conversion film or other suitable release layer) may be coated between the first carrier 10 and the first circuit structure 110 (not shown) to enhance the delaminate ability between the first carrier 10 and the first circuit structure 110 in the subsequent process, and improve flatness of the first circuit structure 110, thereby the reliability of the subsequent bonding process is improved, but the disclosure is not limited thereto.

In some embodiments, each first circuit layer 111 may include a first conductive pattern 111a, a first dielectric layer 111b and/or a first conductive via 111c. In here, the first conductive pattern 111a and the first conductive via 111c may be embedded in the first dielectric layer 111b, but the disclosure is not limited thereto.

In the embodiment, the first conductive via 111c gradually increases (such as a width or a diameter gradually increases) toward a direction away from the first carrier 10, in other words, the first conductive via 111c gradually decreases toward a direction close to the first carrier 10 (such as the width or the diameter gradually decreases), but the disclosure is not limited thereto.

It should be noted that the first circuit structure 110 shown in FIG. 1B is only exemplary, according to different circuit design requirements, each first circuit layer 111 may have circuits not shown in the figure. For example, the first circuit layer 111 close to of the first carrier 10 may be arranged by conductive features for connecting to other components. In addition, the first conductive pattern 111a, the first dielectric layer 111b and/or the first conductive via 111c may also be arranged at different positions.

In some embodiments, the first circuit structure 110 is a back end of line (BEOL) type (may be used to connect a plurality of transistors), that is, the first circuit structure 110 is manufactured according to the back end of line design rule, wherein based on a material of the first dielectric layer 111b (such as including silicon nitride ($Si_3N_4$), silicon oxide ($SiO_2$) or other suitable inorganic material) is selected, a thickness of the first dielectric layer 111b of the first circuit layer 111 is less than 1 micrometer to reduce internal material stress, thereby probability of crack is decreased, but the disclosure is not limited thereto.

In some embodiments, the back end of line design rule may use chemical and mechanical polishing processes to make a line width/line space of a copper conductive line ranges from about 0.2 micrometers to about 1 micrometer, but the disclosure is not limited thereto.

In some embodiments, the first circuit structure 110 is a thin film distribution layers type (may be used for interposer), that is, the first circuit structure 110 is manufactured according to the thin film distribution layers design rule, wherein based on a material of the first dielectric layer 111b (including photo sensitive polyimide (PSPI), benzocyclobutene (BCB) or other suitable organic material) is selected, a thickness of the first dielectric layer 111b of the first circuit layer 111 ranges from 1 micrometer to 10 micrometers to reduce internal material stress, thereby probability of crack is decreased, but the disclosure is not limited thereto.

In some embodiments, the thin film distribution layers design rule may be to manufacture a copper conductive line (the first circuit layer 111) on a dielectric material (the first dielectric layer 111b) such as photo sensitive polyimide to make a line width/line space of the copper conductive line ranges from about 1.5 micrometers to about 10 micrometers, but the disclosure is not limited thereto.

In some embodiments, the first circuit structure 110 is a build-up substrate type, that is, the first circuit structure 110 is manufactured according to the build-up substrate design rule, wherein based on a material of the first dielectric layer 111b (such as including ABF material or ABF derived material) is selected, a thickness of the first dielectric layer 111b of the first circuit layer 111 ranges from 8 micrometers to 30 micrometers, but the disclosure is not limited thereto.

In some embodiments, the build-up substrate design rule may be manufactured by a vacuum lamination method with the ABF material, wherein a line width/line space of a copper conductive layer (the first circuit layer 111) on the ABF material (the first dielectric layer 111b) ranges from about 5 micrometers (um) to about 25 micrometers, but the disclosure is not limited thereto.

In some embodiments, the first circuit structure 110 is a printed circuit board (PCB) type, that is, the first circuit structure 110 is manufactured according to the printed circuit board design rule, wherein based on a material of the first dielectric layer 111b (such as semi-cured adhesive (prepreg, pp) with filling material of glass fiber or bismaleimide triazine (BT)), a thickness of the first dielectric layer 111b of the first circuit layer 111 ranges from 15 micrometers to 60 micrometers to reduce internal material stress, thereby probability of crack is decreased, but the disclosure is not limited thereto.

In some embodiments, the printed circuit board design rule may be a PCB mass production process well known for those skilled in the art, a line width/line space of a copper conductive line (the first circuit layer 111) on the dielectric layer (the first dielectric layer 111b) ranges from about 25 micrometers to 75 micrometers, but the disclosure is not limited thereto.

In some embodiments, a material of the first conductive pattern 111a and the first conductive via 111c in the above various types may include copper, gold, nickel, aluminum, platinum, tin, graphene, combinations thereof, alloys thereof, or other suitable conductive materials, but the disclosure is not limited thereto.

In some embodiments, a planarization process (such as a grinding process, a chemical mechanical polishing process, or a combination thereof) is performed on the top surface 110t of the first circuit layer 111 at a top portion, such that the first conductive pattern 111a of the first circuit layer 111 at the top portion and a top surface of the first dielectric layer 111b at the top portion are coplanar, wherein the first conductive pattern 111a exposed by the top surface 110t after the planarization process may be used for electrical connection with other circuit structures (such as a second circuit structure 120 in FIG. 1B).

Figure 1C:
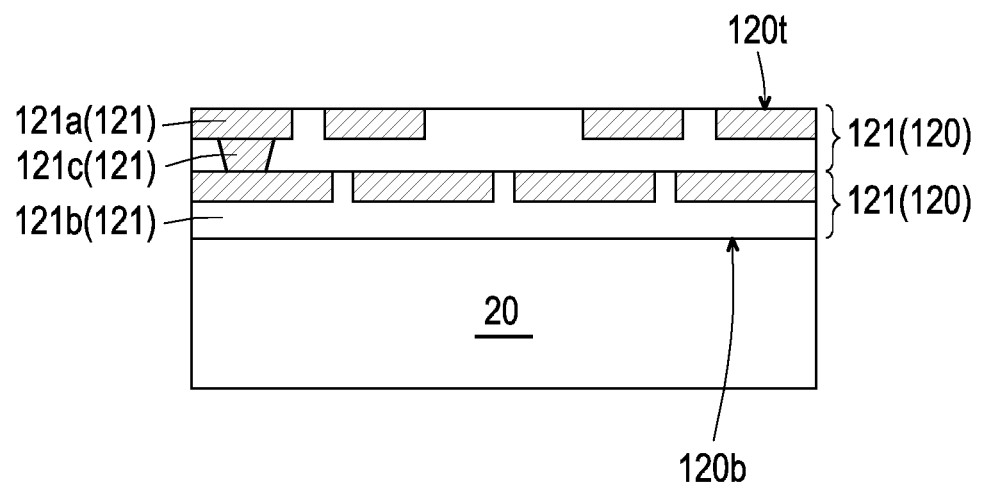

Referring to FIG. 1A and FIG. 1C, the second circuit structure 120 including a plurality of second circuit layers 121 (FIG. 1C schematically illustrates two second circuit layers 121) is formed on the second carrier 20, wherein the second carrier 20 may be a temporary carrier made of glass, plastic, silicon, metal, or other suitable materials in the embodiment. Therefore, the second carrier 20 may only have a carrying function but not have a wiring function, and active devices and/or passive devices not include therein, but the disclosure is not limited thereto. In here, the second circuit structure 120 includes a first surface 120t and a second surface 120b which are opposite to each other, and the second surface 120b is closer to the second carrier 20 than the first surface 120t.

In the embodiment, since the second carrier 20 is a temporary carrier, a release layer (such as a photothermal conversion film or other suitable release layer) may be coated between the second carrier 20 and the second circuit structure 120 (not shown) to enhance the delaminate ability between the second carrier 20 and the second circuit structure 120 in the subsequent process, and improve flatness of the second circuit structure 120, thereby the reliability of the subsequent bonding process is improved, but the disclosure is not limited thereto.

In some embodiments, each second circuit layer 121 may include a second conductive pattern 121a, a second dielectric layer 121b, and/or a second conductive via 121c. In here, the second conductive pattern 121a and the second conductive via 121c may be embedded in the second dielectric layer 121b, but the disclosure is not limited thereto.

In the embodiment, the second conductive via 121c gradually increases (such as a width or a diameter gradually increases) toward a direction away from the second carrier 20, in other words, the second conductive via 121c gradually decreases toward a direction close to the first carrier 10 (such as the width or the diameter gradually decreases), but the disclosure is not limited thereto.

It should be noted that the second circuit structure 120 shown in FIG. 1C is only exemplary, according to different circuit design requirements, each second circuit layer 121 may have circuits not shown in the figure. For example, the second circuit layer 121 close to the second carrier 20 may be arranged by conductive features for connecting to other components. In addition, the second conductive pattern 121a, the second dielectric layer 121b and/or the second conductive via 121c may also be arranged at different positions.

In some embodiments, the second circuit structure 120 is a back end of line type, that is, the second circuit structure 120 is manufactured according to the back end of line design rule (similar to the above description, which will not be described again), wherein based on a material of the second dielectric layer 121b (such as including silicon nitride, silicon oxide, or other suitable inorganic material) is selected, a thickness of the second dielectric layer 121b of the second circuit layer 121 is less than 1 micrometer to reduce internal material stress, thereby probability of crack is decreased, but the disclosure is not limited thereto.

In some embodiments, the second circuit structure 120 is a thin film distribution layers type, that is, the second circuit structure 120 is manufactured according to the thin film distribution layers design rule (similar to the above description, which will not be described again), wherein based on a material of the second dielectric layer 111b (including photo sensitive polyimide, benzocyclobutene, or other suitable organic material) is selected, a thickness of the second dielectric layer 121b of the second circuit layer 121 ranges from 1 micrometer to 10 micrometers to reduce internal material stress, thereby probability of crack is decreased, but the disclosure is not limited thereto.

In some embodiments, the second circuit structure 120 is a build-up substrate type, that is, the second circuit structure 120 is manufactured according to the build-up substrate design rule (similar to the above description, which will not be described again), wherein based on a material of the second dielectric layer 121b (such as including ABF material or ABF derived material) is selected, a thickness of the second dielectric layer 121b of the second circuit layer 121 ranges from 8 micrometers to 30 micrometers to reduce internal material stress, thereby probability of crack is decreased, but the disclosure is not limited thereto.

In some embodiments, the second circuit structure 120 is a printed circuit board (PCB) type, that is, the second circuit structure 120 is manufactured according to the printed circuit board design rule (similar to the above description, which will not be described again), wherein based on a material of the second dielectric layer 121b (such as semi-cured adhesive with filling material of glass fiber or bismaleimide triazine) is selected, a thickness of the second dielectric layer 121b of the second circuit layer 121 ranges from 15 micrometers to 60 micrometers to reduce internal material stress, thereby probability of crack is decreased, but the disclosure is not limited thereto.

In some embodiments, a material of the second conductive pattern 121a and the second conductive via 121c in the above various types may include copper, gold, nickel, aluminum, platinum, tin, combinations thereof, alloys thereof or other suitable conductive materials, but the disclosure is not limited thereto.

It should be noted that the thickness of the dielectric layer described in the disclosure is the thickness of a single layer. In addition, the pitch (space) arranged in order from small to large may be the back end of line type, the thin film distribution layers type, the build-up substrate type, and the printed circuit board type, wherein the pitch may be based on the minimum pitch among various types, but the disclosure is not limited thereto.

In some embodiments, the pitch may in the circuit layer is, for example, the distance between the center points of two adjacent circuits or the distance between two adjacent pads. Therefore, the aforementioned pitch may be based on the actual requirements of the design to use, there is not limited by the disclosure.

Figure 1D:
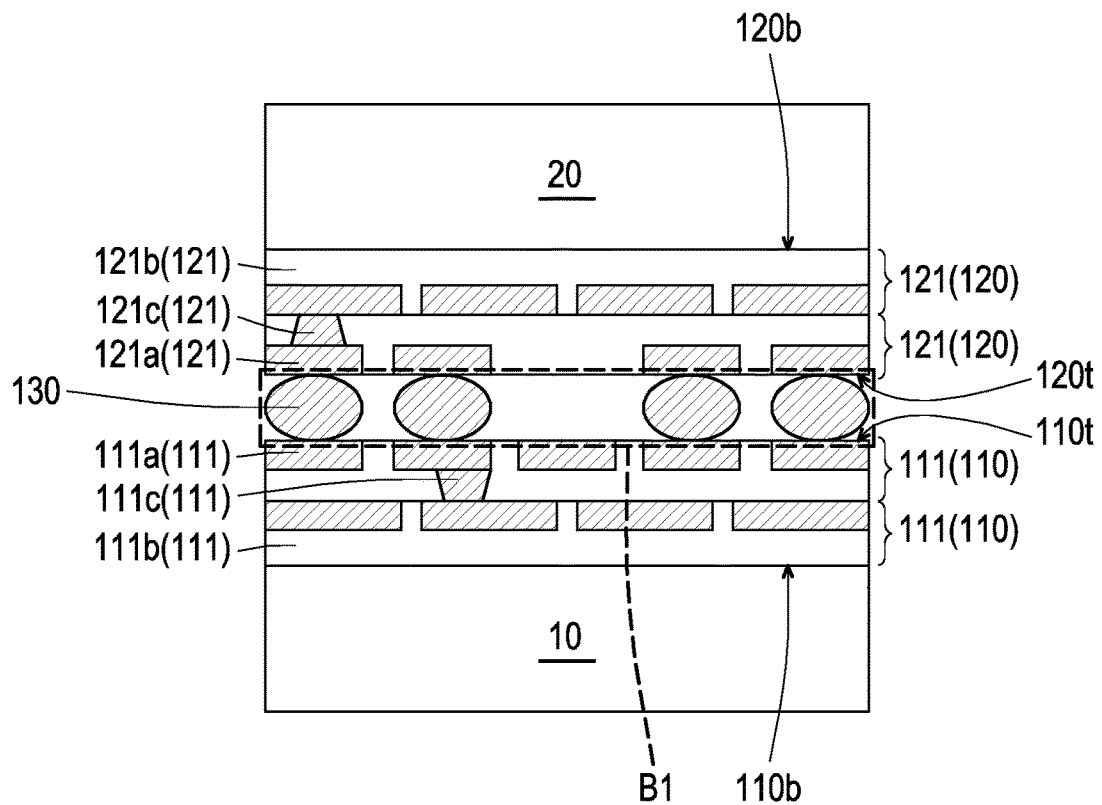
Figure 1E:
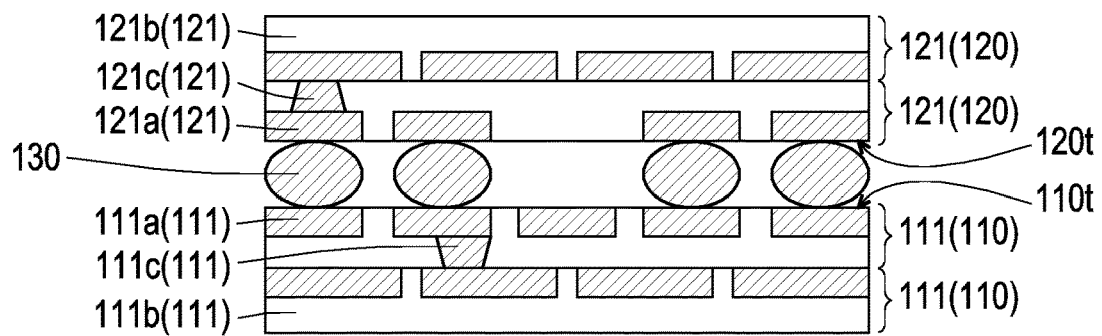
Figure 1F:
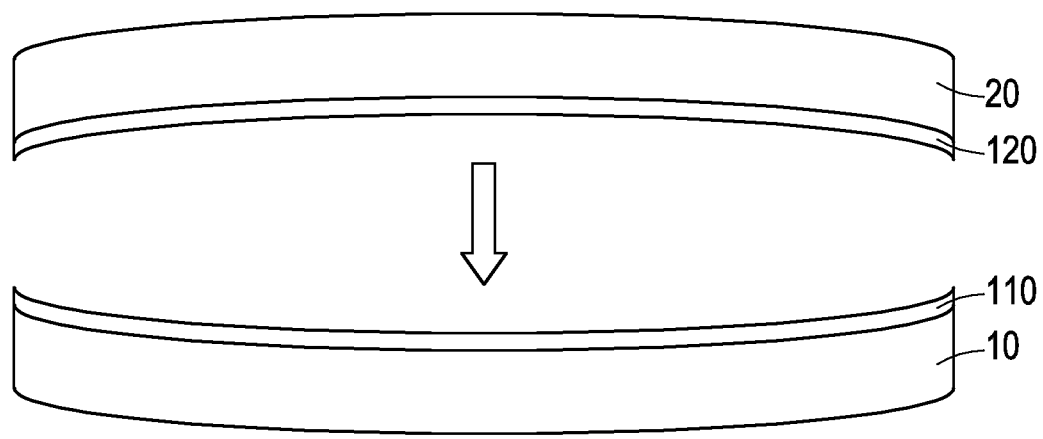
FIG. 1F is a schematic view illustrating a bond of a semiconductor substrate according to some embodiments of the disclosure.
Figure 1G:
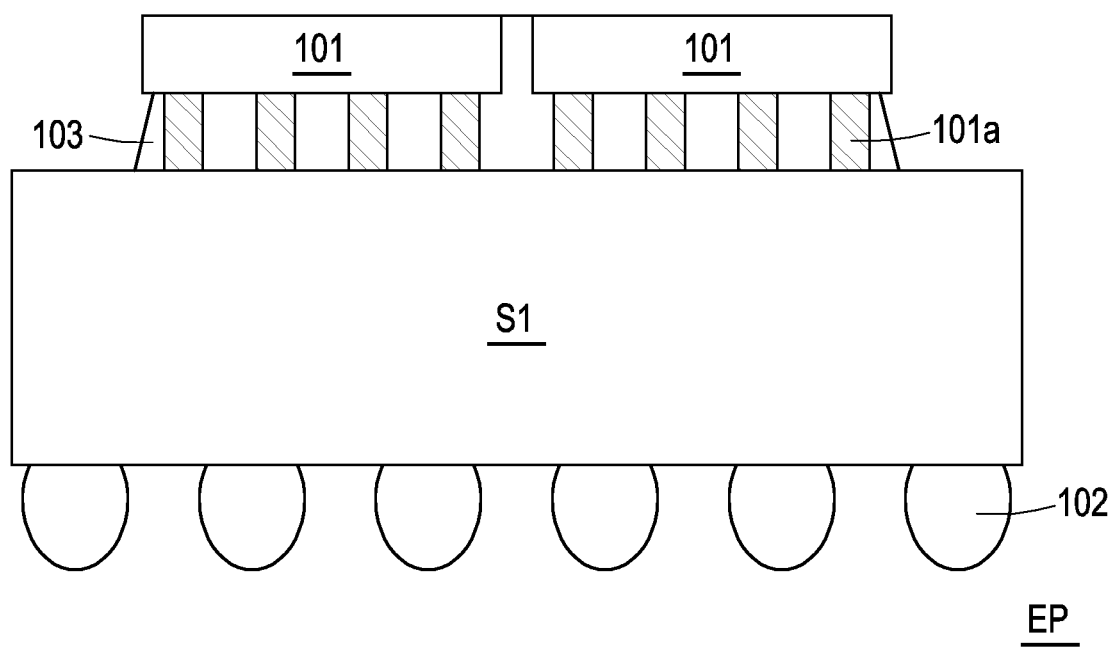
FIG. 1G and FIG. 1H are partial schematic cross-sectional views illustrating an electronic package including of a semiconductor substrate of some embodiments of the disclosure.
Figure 1H:
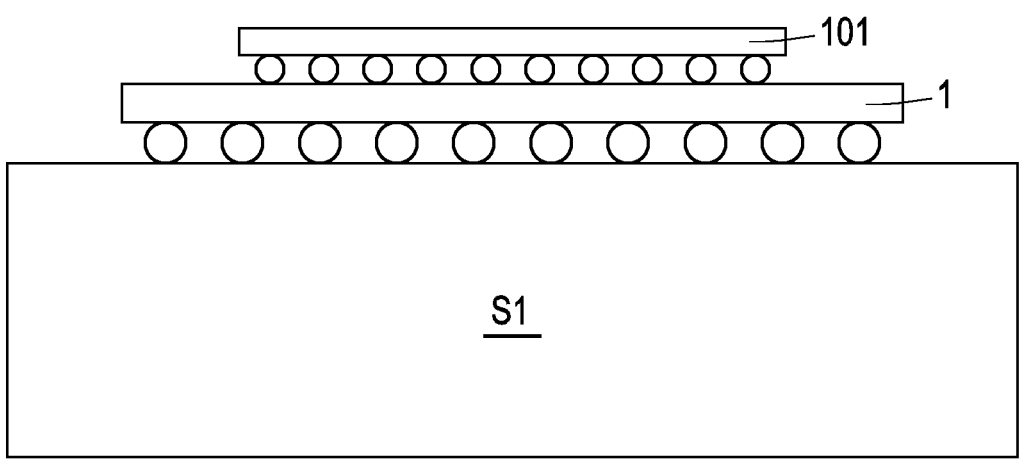

Referring to FIG. 1A, FIG. 1D to FIG. 1E, the structure shown in FIG. 1C is flipped upside down, the first circuit structure 110 and the second circuit structure 120 are bonded, such that the first circuit structure 110 and the second circuit structure 120 are electrically connected to each other. Next, in the embodiment, since the first carrier 10 and the second carrier 20 are both temporary carriers, therefore, the first carrier 10 and the second carrier 20 may be removed by suitable methods (such as applying external energy between the bottom surface of the circuit structure and the temporary carrier to delaminate the release layer) to constitute a semiconductor substrate S1. Accordingly, in the embodiment, a plurality of circuit structures (such as the first circuit structure 110 and the second circuit structure 120) are first manufactured separately, and then assembles the aforementioned circuit structures into the semiconductor substrate S1, such hat compared with the production for single process sequentially of the semiconductor substrate S1, the degree of warpage can be effectively reduced, allowing the semiconductor substrate S1 to maintain better yields and improve the electrical performance in subsequent applications while having a multi-layer circuit structure.

Furthermore, due to process limitations, difficulty is positively correlated with the number of layers to be produced. Therefore, when more layers would be produced, probability that the entire semiconductor substrate will be damaged during the manufacturing process is higher, thereby the problems of yield and cost cannot be effectively controlled. In the embodiment, the semiconductor substrate S1 is split into multiple groups of circuit structures with a smaller number of layers and manufactured separately, therefore, the problem of continuous stacking for multiple layers which cannot effectively control yield and cost may be avoided. In addition, due to the difference in the coefficient of thermal expansion (CTE), warpage will be occurred, and the situation will become more serious as more layers are stacked, therefore, when the semiconductor substrate is continuously produced by single process sequentially, the amplitude of warpage will accumulate and increase. In the embodiment, the semiconductor substrate is disassembled into a plurality of circuit structures (the first circuit structure 110 and the second circuit structure 120) manufactured separately, and then one of the circuit structures is flipped upside down for bonding (a bonding plane tends to horizontal by above pressure and down pressure), in this way, by having different warpage directions in upper portion and down portion, that is, a warpage direction of the first circuit structure 110 is opposite to a warpage direction of the second circuit structure 120, the stress may be effectively offset, thereby the warpage situation is reduced, such as shown in FIG. 1F.

In some embodiments, a size of the first circuit structure 110 (such as a width from a left edge to a right edge shown in the figure) is the same as a size of the second circuit structure 120 (such as a width from the left edge to the right edge shown in the figure), therefore, it may be more evenly offset the stress which can significantly improve the warpage situation, but the disclosure is not limited thereto.

In some embodiments, the first circuit structure 110 and the second circuit structure 120 are the same type, for example, the first circuit structure 110 and the second circuit structure 120 are both the back end of line type, the thin film distribution layers type, the build-up substrate type, or the printed circuit board type, but the disclosure is not limited thereto, the first circuit structure 110 and the second circuit structure 120 may also be different types, for example, the first circuit structure 110 is the back end of line type, the second circuit structure 120 is the thin film distribution layers type; the first circuit structure 110 is the back end of line type, the second circuit structure 120 is the build-up substrate type; the first circuit structure 110 is a back end of line type, the second circuit structure 120 is the printed circuit board type, and so on.

In some embodiments, when the line pitch/space (L/S) (such as line width) becomes thinner, the manufacturing process requirements will be more stringent, therefore, when the first circuit structure 110 and the second circuit structure 120 are the back end of line type or the thin film distribution layers type, using the method of assembling bonding multiple groups of circuit structures may have greater advantages in yields and electrical performance than the continuously formed structures, but the disclosure is not limited thereto.

In here, whether the first circuit structure 110 and the second circuit structure 120 are the same type or different type, they may have different thickness and line pitch according to actual design requirements, for example, as shown in FIG. 1G, an electronic package EP may include a semiconductor substrate S1, a plurality of chips 101 (FIG. 1G schematically illustrates two chips 101, but it also may be more than two, such as three or four, etc.), and a plurality of external terminals 102, wherein the chips 101 and the external terminals 102 are disposed on the opposite surfaces of the semiconductor substrate S1 respectively, the pitch of the circuit in the circuit structure close to the chips 101 may be smaller than the pitch of the circuit in the circuit structure close to the external terminals 102, that is, the circuit structures of the semiconductor substrate S1 may include both a fine pitch and a coarse-pitch to fan out the signal of chips 101 to the external terminals 102, but the disclosure is not limited thereto. In another embodiment, as shown in FIG. 1H, an electronic package EP2 may include the semiconductor substrate S1, an interposer 1, and the chip 101, wherein the interposer 1 is arranged between the semiconductor substrate S1 and the chip 101, and the interposer 1 may be any of any suitable type, the disclosure is not limited. In here, the semiconductor substrate S1 may be a combination of the thin film distribution layers type and the build-up substrate type. The semiconductor substrate S1 may also be replaced by the semiconductor substrate in any of the following embodiments, which will not be described again in below.

In some embodiments, the chip 101 may be connected to a surface of the semiconductor substrate S1 using, for example, flip chip bonding. For example, a plurality of conductive bumps 101a of the chip 101 may be in direct contact with the surface circuit of the semiconductor substrate S1 to form the electrical connection, but the disclosure is not limited thereto. The chip 101 may also be bonded to the surface of the semiconductor substrate S1 using other suitable methods. In here, the chips 101 may be performed the same or different functions.

In some embodiments, the chip 101 is, for example, logic chip, memory chip, three-dimensional integrated circuit (3DIC) chip (such as high bandwidth memory chip), XPU, I/O, CPO and/or the like, wherein the 3DIC chip includes multiple layers stacked on each other, and through silicon vias (TSVs) are formed to provide vertical electrical connections between the layers, but the disclosure is not limited thereto. In here, the chip 101 may be a small chip form (chiplet).

In some embodiments, an underfill 103 is formed on the surface of the semiconductor substrate S1 to fill a gap between the surface of the semiconductor substrate S1 and the chips 101, thereby the reliability of flip chip bonding is enhanced, but the disclosure is not limited thereto.

In some embodiments, the external terminals 102 may be solder balls and may be formed using a ball placement process to be placed on the surface of the semiconductor substrate S1 away from the chips 101, and a soldering process and a reflow process may be optionally performed to enhance the adhesion between the external terminals 102 and the circuits on the surface of the semiconductor substrate S1, but the disclosure is not limited thereto.

In some embodiments, a semiconductor component (such as an active device and/or a passive device) is not included between the first circuit structure 110 and the second circuit structure 120, in other words, the semiconductor substrate composed of the first circuit structure 110 and the second circuit structure 120 only has wiring functions to reduce a size of the substrate, but the disclosure is not limited thereto.

It should be noted that the various embodiments of the semiconductor substrate described in the disclosure may be applied to the electronic package with similar rules, and will not be described again in the subsequent description.

In the embodiment, the first circuit structure 110 and the second circuit structure 120 are electrically connected through a connector 130, wherein the connector 130 may be a solder ball or the like which is pre-formed on a top portion of the second conductive pattern 121a in FIG. 1B, but the disclosure is not limited thereto.

In some embodiments, after bonding, adjacent the first dielectric layer 111b and the second dielectric layer 121b are not in direct contact, and adjacent the first circuit layer 111 and the second circuit layer 121 are bonded and connected through the connector 130 (such as a solder ball), wherein a bonding area B1 is between the second circuit structure 120 and the first circuit structure 110, while the first conductive via 111c of the first circuit layer 111 gradually increases in the direction toward the bonding area B1, and the second conductive via 121c of the second circuit layer 121 gradually increases in the direction toward the bonding area B1, but the disclosure is not limited thereto.

In some embodiments, another electrical connection manner is applied between the first circuit structure 110 and the second circuit structure 120. As shown in FIG. 2A, the connector may be a conductive pillar 230, and the conductive pillar 230 may be bonded to the first circuit structure 110 through a conductive cap 230a. In here, the conductive pillar 230 may be made of copper, and the conductive cap 230a may be made of solder, but the disclosure is not limited thereto. The conductive pillar 230 and the conductive cap 230a may also be made of other suitable materials. For example, the conductive cap 230a may be Sn/Ag lead-free solder.

In FIG. 2B and FIG. 2C, following by the FIG. 2A, since the first carrier 10 and the second carrier 20 are both temporary carriers, therefore, the first carrier 10 and the second carrier may be removed by suitable methods (such as applying external energy between the bottom surface of the circuit structure and the temporary carrier to delaminate the release layer) to form a semiconductor substrate. Meanwhile, in order to apply to high-density interconnection flexible cable, the semiconductor substrate further includes an additional structure 125 disposed beside the structure of FIG. 2A, wherein the additional structure 125 includes a core portion 125a, a first conductive layer 125b, a second conductive layer 125c, a first cable component 125d, and a second cable component 125e.

In some embodiments, the core portion 125a includes the first side and second side opposite to each other for supporting function. The first conductive layer 125b and the first cable component 125d are disposed on the first side of the core portion 125a, the second conductive layer 125c and the second cable component 125e are disposed on the second side of the core portion 125a. The first conductive layer 125b is extended from the first conductive pattern 111a, the second conductive layer 125c is extended from the second conductive pattern 121a. Further, the first cable component 125d is disposed on the first conductive layer 125b and the second cable component 125e is disposed on second conductive layer 125c for external connecting (such as inserting into a slot).

In some embodiments, after bonding, adjacent the first dielectric layer 111b and the second dielectric layer 121b are not in direct contact, and adjacent the first circuit layer 111 and the second circuit layer 121 are bonded through the conductive pillar 230, wherein a bonding area B2 is between the second circuit structure 120 and the first circuit structure 110, and the first conductive via 111c of the first circuit layer 111 gradually increases in the direction toward the bonding area B2, and the second conductive via 121c of the second circuit layer 121 gradually increases in the direction toward the bonding area B2, but the disclosure is not limited thereto.

In some embodiments, another electrical connection manner is applied between the first circuit structure 110 and the second circuit structure 120, as shown in FIG. 3, the connector may be omitted, in other words, the first circuit structure 110 and the second circuit structure 120 may be direct bonded by a Cu to Cu hybrid bonding process, or copper to copper direct bonding process, such that the first conductive pattern 111a is in direct contact with the second conductive pattern 121a, and the first dielectric layer 111b is in direct contact with the second dielectric layer 121b, wherein the first conductive pattern 111a is, for example, substantially aligned with the second conductive pattern 121a, however, due to the design of process conditions, the first conductive pattern 111a may also be partial staggered with the second conductive pattern 121a. In addition, since no solder material is used for bonding the first circuit structure 110 and the second circuit structure 120, they may be regarded as a solderless connection.

In some embodiments, after bonding, adjacent the first dielectric layer 111b and the second dielectric layer 121b are in direct contact with each other, and adjacent the first conductive pattern 111a and the second conductive pattern 121a are in direct contact with each other, wherein a bonding area B3 between the second circuit structure 120 and the first circuit structure 110, while the first conductive via 111c of the first circuit layer 111 gradually increases in the direction toward the bonding area B3, and the second conductive via 121c of the second circuit layer 121 gradually increases in the direction toward the bonding area B3, but the disclosure is not limited thereto.

It is to be noted that the following embodiments use the reference numerals and a part of the contents of the above embodiment, and the same or similar reference numerals are used to denote the same or similar elements, and the description of the same technical content is omitted.

For the description of the omitted part, reference may be made to the above embodiments, and details are not described in the following embodiments.

FIG. 4A, FIG. 4B, FIG. 4C, and FIG. 5 are partial schematic cross-sectional views illustrating a semiconductor substrate according to some embodiments of the disclosure. FIG. 4D is a partial schematic cross-sectional view illustrating an electronic package including of a semiconductor substrate of some embodiments of the disclosure.

Figure 4A:
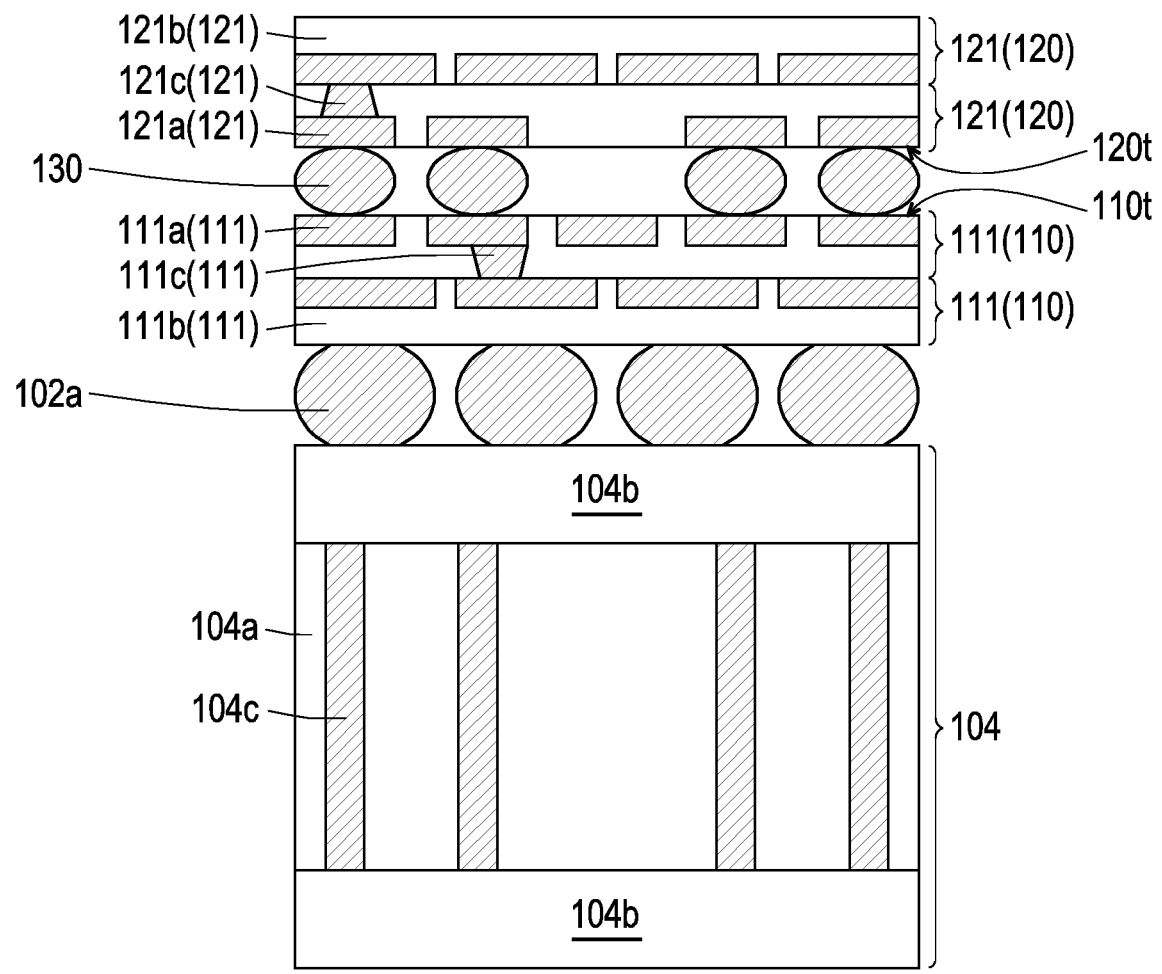
FIG. 4A, FIG. 4B, FIG. 4C, and FIG. 5 are partial schematic cross-sectional views illustrating a semiconductor substrate according to some embodiments of the disclosure.

Referring to FIG. 4A, compared with the semiconductor substrate S1 of FIG. 1E, a semiconductor substrate S2 of this embodiment further includes a circuit board 104 disposed on the first circuit structure 110, wherein the circuit board 104 may be a printed circuit board (PCB) or may be a multi-layer ceramic substrate, but the disclosure does not limit the type of the circuit board. It should be noted that the circuit board 104 may also be disposed on the second circuit structure 120 (not shown).

For example, the circuit board 104 includes a core dielectric layer 104a, build-up structures 104b disposed on opposite sides of the core dielectric layer 104a, and conductive through holes 104c penetrating the core dielectric layer 104a, wherein the conductive through holes 104c are served as vertical conductive paths, such that the build-up structures 104b disposed on opposite sides of the core dielectric layer 104a may be electrically connected to each other through the conductive through holes 104c.

In this embodiment, the internal circuits of the built-up structures 104b are not shown, and the internal circuits design may be determined according to actual design requirements, for example, the internal circuits of the build-up structure 104b may include a dielectric layer and a conductive layer (which may include conductive lines, conductive vias, conductive pads, and other conductive features) sequentially stacked on the core dielectric layer 104a.

In some embodiments, a material of the core dielectric layer 104a includes prepreg, glass or other suitable dielectric materials, and the conductive through holes 104c and the conductive features of the build-up structure 104b may include copper or other suitable conductive materials, for example, when the core dielectric layer 104a is glass, the circuit board 104 may be called a glass core substrate which has the advantage of high flatness, but the disclosure is not limited thereto.

In FIG. 4A, the first circuit structure 110 and the circuit board 104 are electrically connected to each other through connectors 102a, the first circuit structure 110 and the second circuit structure 120 are electrically connected to each other through the connectors 130, but the disclosure is not limited thereto, in an embodiment not shown, the connectors 102a may be omitted between the first circuit structure 110 and the circuit board 104, and the electrical connection may be made through a suitable direct bonding process, and the connectors 130 may also be omitted between the first circuit structure 110 and the second circuit structure 120, and the electrical connection is made through a suitable direct bonding process.

Figure 4B:
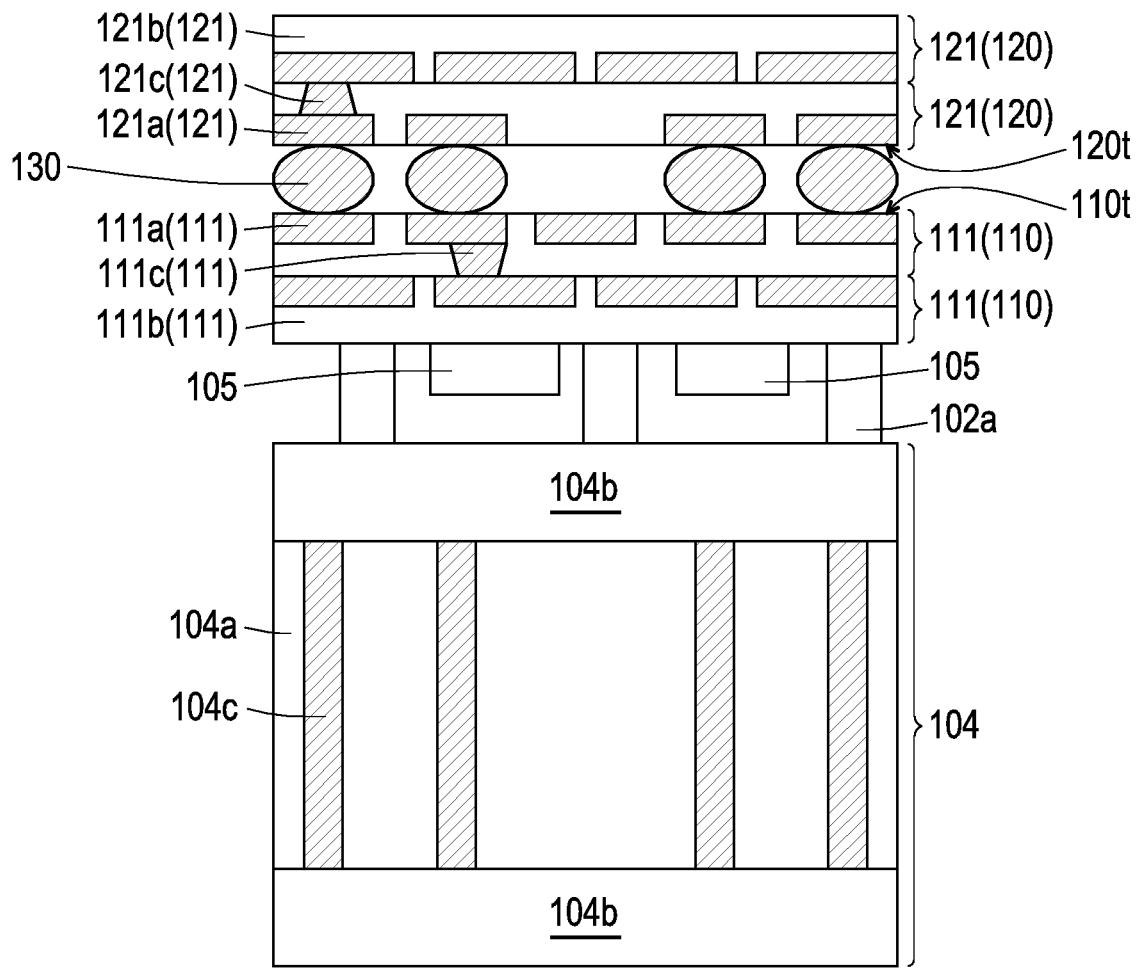

Referring to FIG. 4B, compared with the semiconductor substrate S2 of FIG. 4A, the connectors 102a of a semiconductor substrate S3 of this embodiment is a conductive pillar form, and the adjacent connectors 102a further include first semiconductor components 105 (FIG. 4B schematically illustrates two first semiconductor components 105) to further enhance the application flexibility of the semiconductor substrate S3, but the disclosure is not limited thereto. In here, the first semiconductor component 105 include a die, capacitance, an inductance, or the like.

Figure 4C:
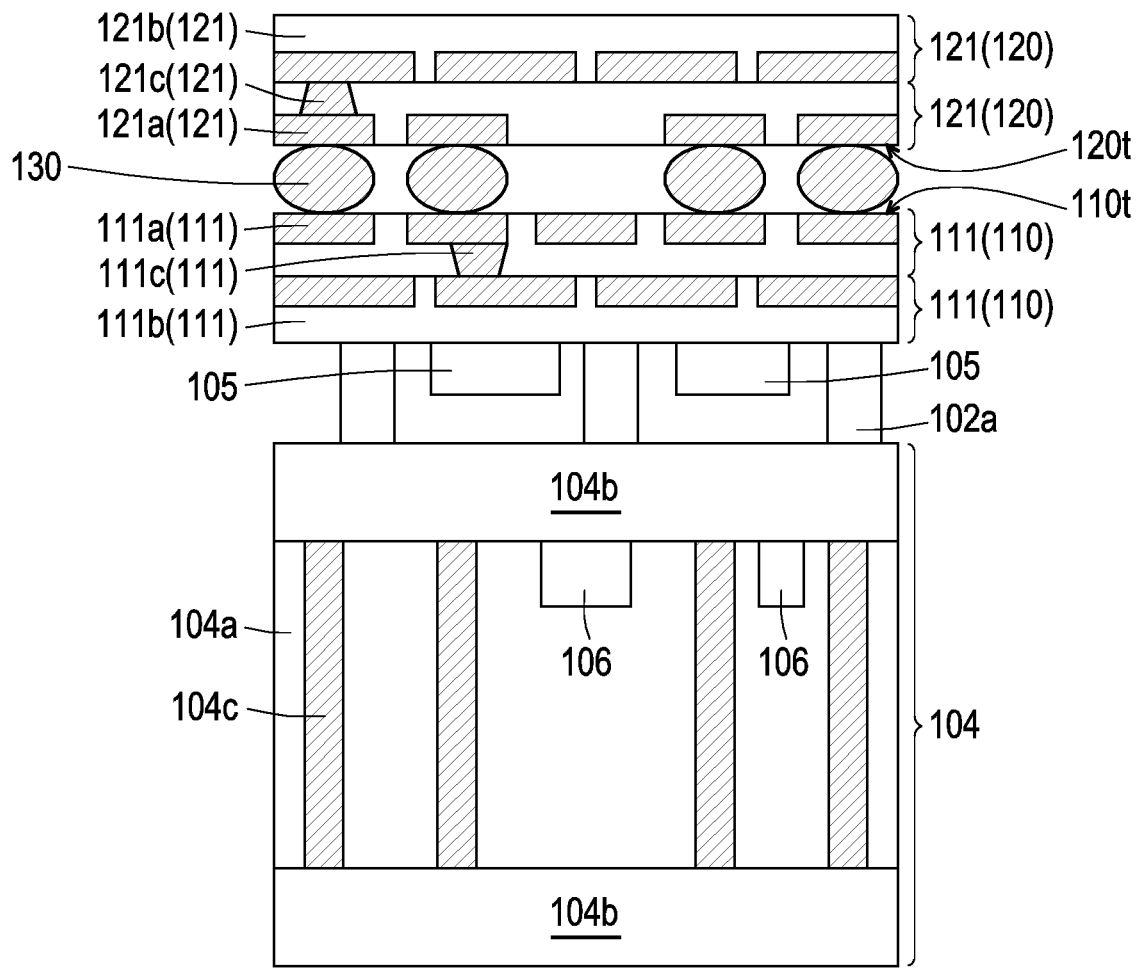
Figure 4D:
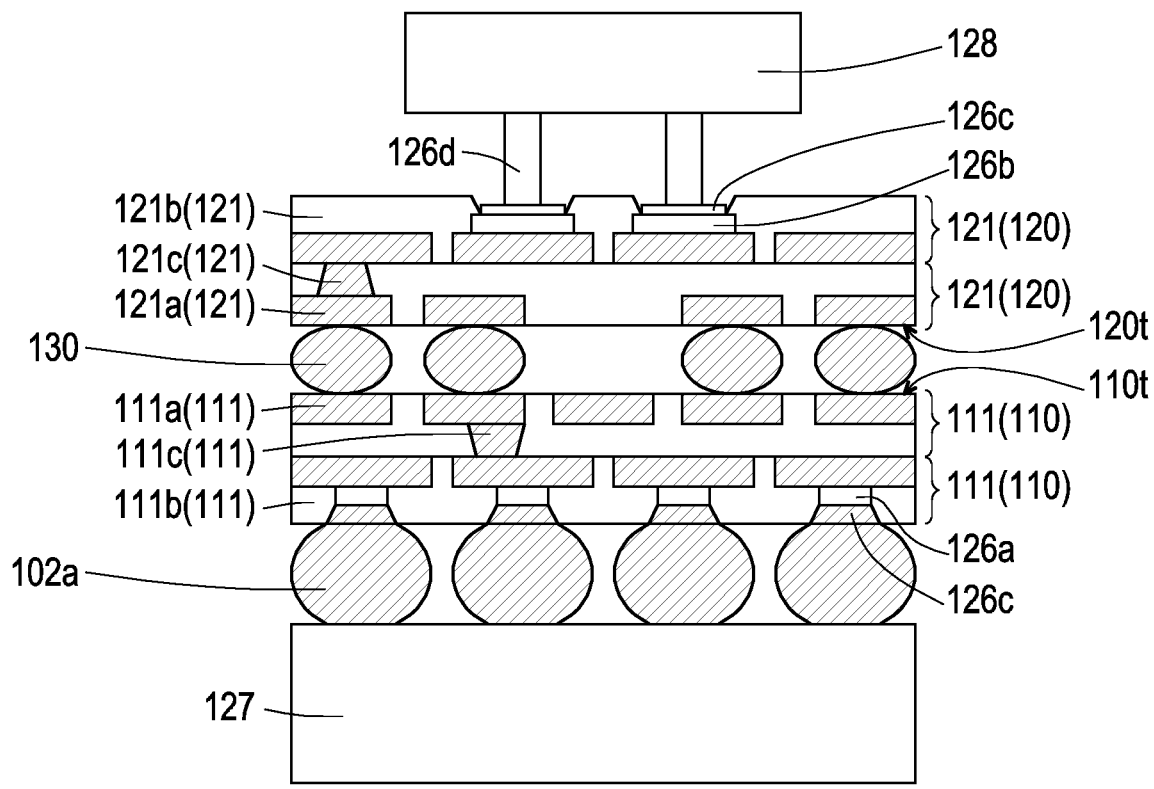
FIG. 4D is a partial schematic cross-sectional view illustrating an electronic package including of a semiconductor substrate of some embodiments of the disclosure.

Referring to FIG. 4C, compared with the semiconductor substrate S3 of FIG. 4B, a semiconductor substrate S4 of this embodiment further includes second semiconductor components 106 (FIG. 4C schematically illustrates two second semiconductor components 106) disposed in the circuit board 104 (such as a glass core substrate) to further improve the application flexibility of the semiconductor substrate S4, but the disclosure is not limited thereto. In here, the second semiconductor component 106 includes a die, a capacitance, an inductance, or the like.

Following by FIG. 4A, a surface finish layer may be formed on an end of the first circuit structure 110 and/or the second circuit structure 120 to constitute the semiconductor substrate. For example, in FIG. 4D, the first surface finish layer 126a may be formed on an end of the first circuit structure 110 and the second surface finish layer 126b may be formed on an end of the second circuit structure 120 for subsequently application. For example, the first surface finish layer 126a is electrically connected to a PCB substrate 127 and the second surface finish layer 126b is electrically connected to a chip 128. In some embodiments, a solder 126c and the connectors 102a are disposed between the first surface finish layer 126a and the PCB substrate 127, while another solder 126c and a pillar 126d are disposed between the second surface finish layer 126b and the chip 128. In some embodiments, the solder 126c and the first surface finish layer 126a are embedded in the first dielectric layer 111*b*, and the another solder 126*c* and the second surface finish layer 126*b* are embedded in the second dielectric layer 121*b*. It should be noted that one of the first surface finish layer 126*a* and second surface finish layer 126*b* can be omitted for suitable application.

Figure 5:
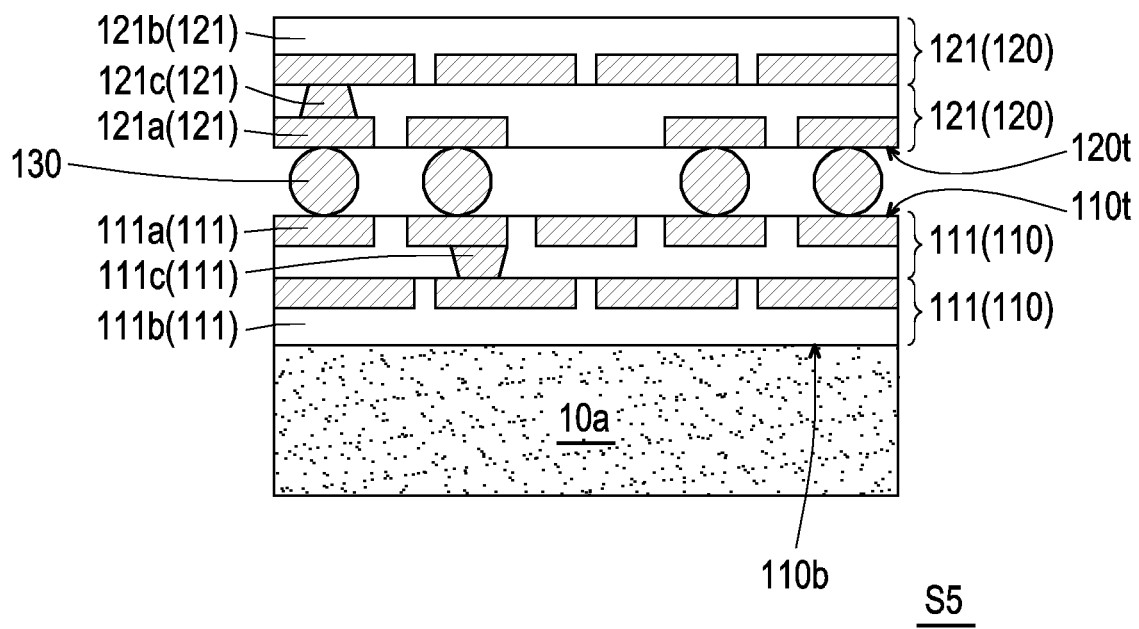

Referring to FIG. 5, compared with the semiconductor substrate S1 of FIG. 1D, a semiconductor substrate S5 of this embodiment further includes a permanent carrier 10*a* disposed on the first circuit structure 110 or the second circuit structure 120, wherein the permanent carrier 10*a* may be replaced the first carrier 10 of FIG. 1B or may be replaced the second carrier 20 of FIG. 1B, and the permanent carrier 10*a* will remain on the semiconductor substrate S5 instead of being removed after the bonding process.

In here, although the permanent carrier 10*a* is schematically showed in direct contact with the first circuit structure 110 in FIG. 5, the disclosure is not limited thereto, the permanent carrier 10*a* may also be in direct contact with the second circuit structure 120. In addition, the permanent carrier 10*a* may be a carrier including circuits, such as the circuit board 104 in FIG. 4 or the like, which will not be described again. However, the disclosure does not limit the type of the permanent carrier 10*a*, as long as it does not affect subsequent applications.

Figure 6A:
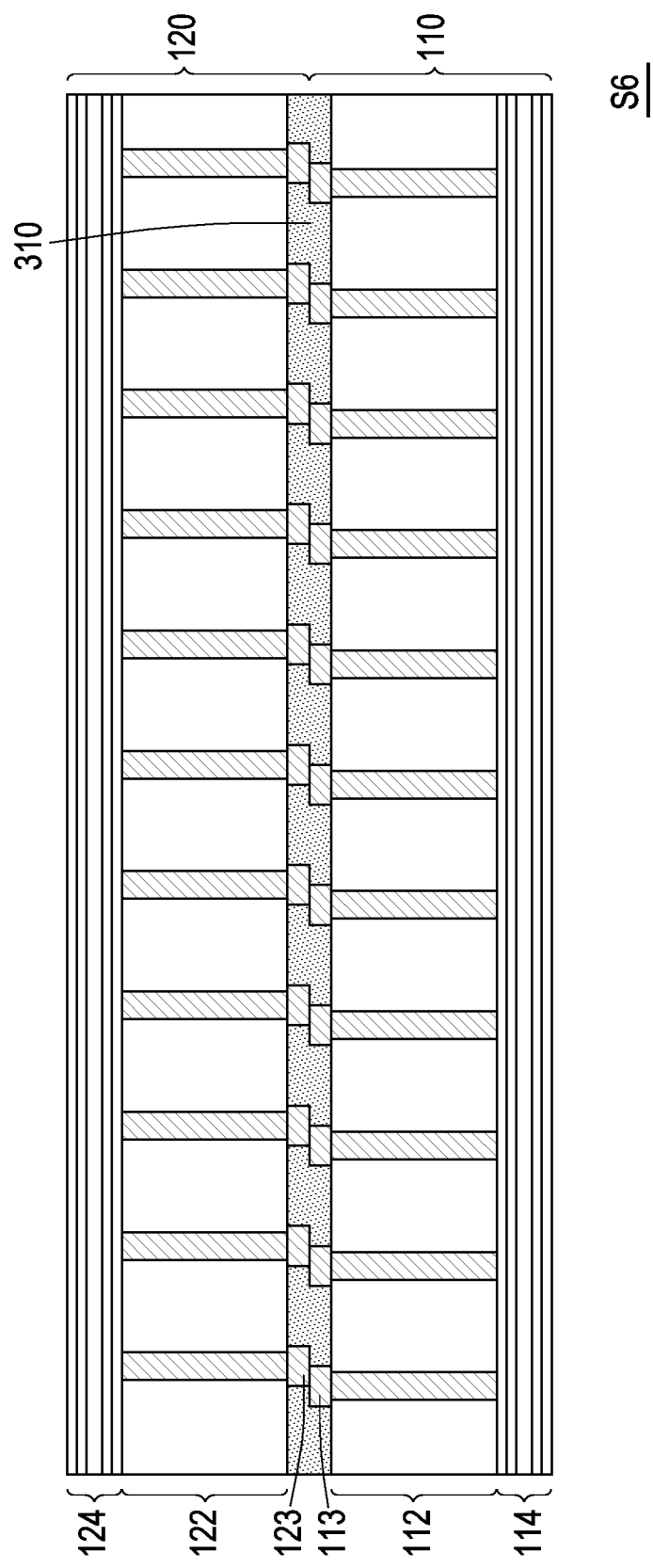
FIG. 6A is a partial schematic cross-sectional view illustrating a semiconductor substrate in accordance with some embodiments of the disclosure.
Figure 6B:
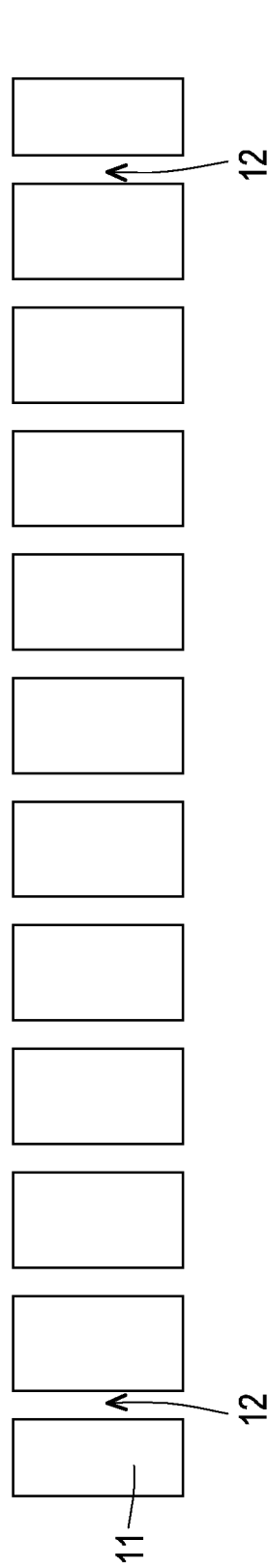
FIG. 6B to FIG. 6D are partial schematic cross-sectional views illustrating a manufacturing method of the first circuit structure or the second circuit structure in FIG. 6A.
Figure 6C:
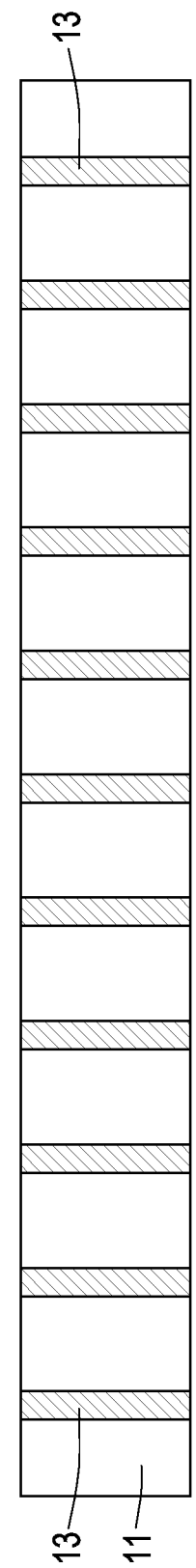
Figure 6D:
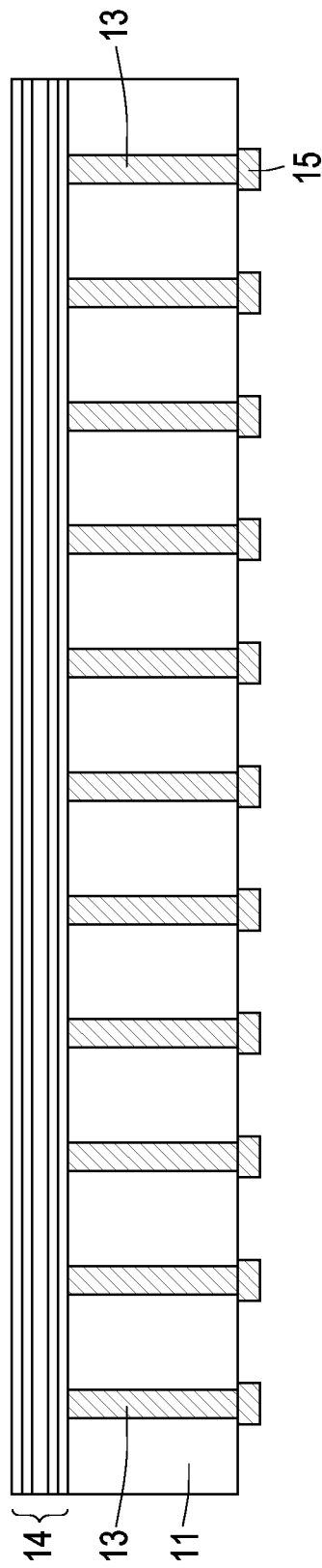
Figure 6E:
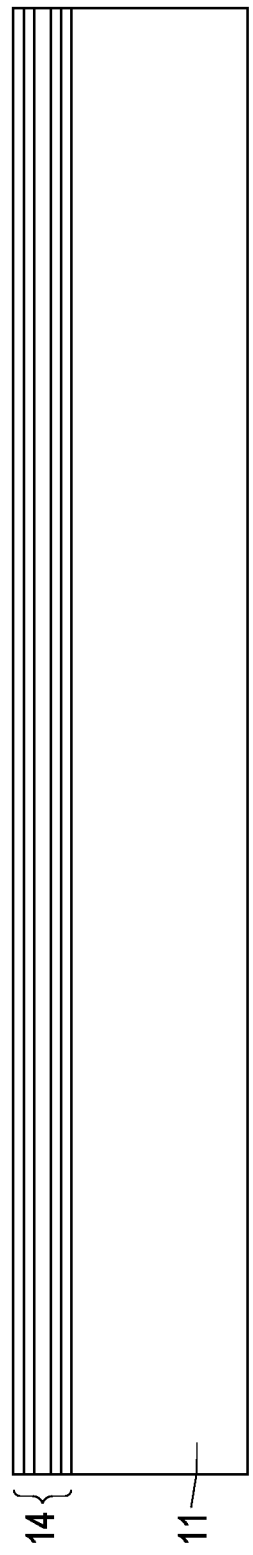
FIG. 6E to FIG. 6G are partial schematic cross-sectional views illustrating another manufacturing method of the first circuit structure or the second circuit structure in FIG. 6A.
Figure 6F:
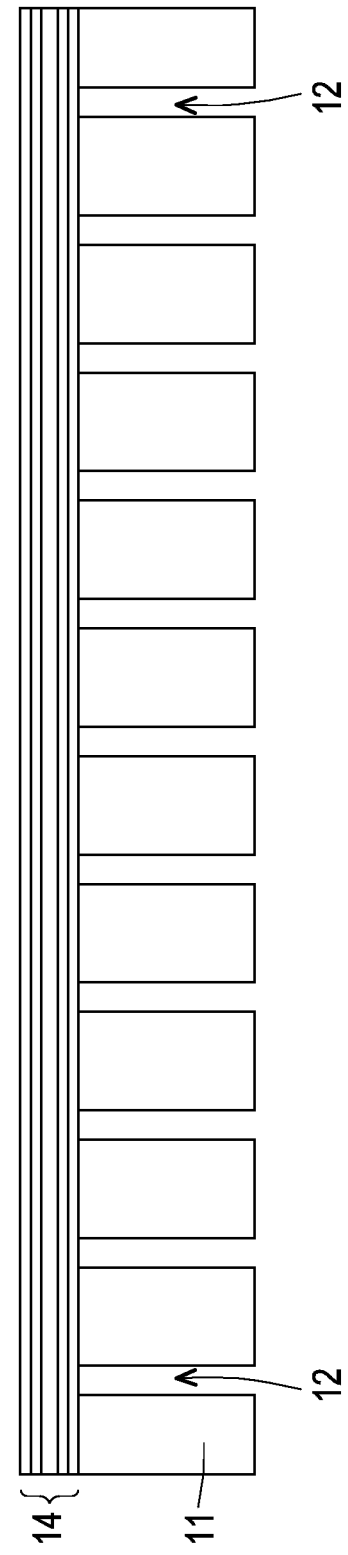
Figure 6G:
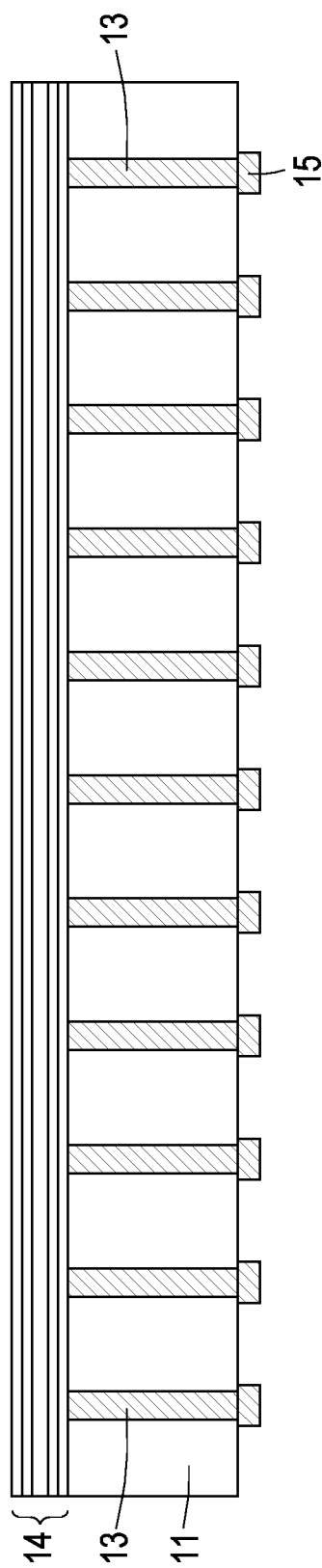

FIG. 6A is a partial schematic cross-sectional view illustrating a semiconductor substrate in accordance with some embodiments of the disclosure. FIG. 6B to FIG. 6D are partial schematic cross-sectional views illustrating a manufacturing method of the first circuit structure or the second circuit structure in FIG. 6A. FIG. 6E to FIG. 6G are partial schematic cross-sectional views illustrating another manufacturing method of the first circuit structure or the second circuit structure in FIG. 6A.

Referring to FIG. 6A, compared with the semiconductor substrate S1 of FIG. 1D, the first circuit structure 110 of a semiconductor substrate S6 of this embodiment is composed of a first glass core substrate 112, a first bonding pad 113 and a first thin-film circuit 114 located on opposite sides thereof, while the second circuit structure 120 is composed of a second glass core substrate 122, a second bonding pad 123 and a second thin-film circuit 124 located on opposite sides thereof. In here, the first thin-film circuit 114 and the second thin-film circuit 124 are optionally formed in this embodiment and subsequent embodiments, that is, the first thin-film circuit 114 and the second thin-film circuit 124 may be omitted, which will not be described again later. In addition, the first thin-film circuit 114 and the second thin-film circuit 124 may be suitable redistribution structures (RDL), which are only schematically shown as alternately stacked circuit layers and dielectric layers (not labeled).

In this embodiment, the first circuit structure 110 and the second circuit structure 120 may be bonded through a bonding layer 310, wherein the bonding layer 310 may be an underfill or a suitable adhesive material, and the bonding method may be hybrid bonding. Furthermore, when the bonding layer 310 is the underfill, the bonding layer 310 may be formed after the first bonding pad 113 and the second bonding pad 123 are directly bonded, therefore, the underfill may fill the gap between the first bonding pad 113 and the second bonding pad 123, while when the bonding layer 310 is the adhesive material, there may be other manufacturing method described in detail below.

In this embodiment, the first glass core substrate 112 and the second glass core substrate 122 respectively include a plurality of through glass vias, and since after the through glass vias in the multiple circuit structures are separately manufactured first, and then the circuit structures are assembled into a semiconductor substrate in the disclosure, such that it may not be necessary to form a large aspect ratio in through glass vias at one time (only a half-size of through glass vias are formed at one time in this embodiment), which may reduce the difficulty of filling metal and may reduce the probability of crack propagation, thereby the reliability of the semiconductor substrate may be effectively improved. In here, the aspect ratio is the depth of through glass via/the diameter of through glass via.

Referring to FIG. 6B to FIG. 6D. In the embodiment which that through glass vias are formed first (TGV first), a plurality of vias 12 may be formed in a glass substrate 11 first, as shown in FIG. 6B. Next, the vias 12 are filled with the conductive metal material to form through glass vias 13, as shown in FIG. 6C. Then, a thin-film circuit 14 is optionally formed on the aforementioned structure, and bonding pads 15 are formed on the through glass vias 13 correspondingly, as shown in FIG. 6D, wherein the aforementioned manufacturing process may be applicable to the first circuit structure 110 and the second circuit structure 120, the glass substrate 11 and the through glass via 13 may be corresponded to the first glass core substrate 112/the second glass core substrate 122, and the bonding pads 15 may be corresponded to the first bonding pads 113/the second bonding pads 123, and the thin-film circuit 14 may be corresponded to the first thin-film circuit 114/the second thin-film circuit 124.

Referring to FIG. 6E to FIG. 6G, in the embodiment which that the through glass vias are formed last (TGV last), the thin-film circuit 14 may optionally be formed on the glass substrate 11 first, as shown in FIG. 6E. Next, the vias 12 are formed in the glass substrate 11, as shown in FIG. 6F. Then, the vias 12 are filled with conductive metal material to form through glass vias 13 and bonding pads 15 are formed thereon correspondingly, as shown in FIG. 6G, wherein the aforementioned manufacturing process may be applicable to the first circuit structure 110 and the second circuit structure 120 and has a similar corresponding relationship, which will not be described again.

It should be noted that in the following embodiments, for clear explanation, the first glass core substrate 112 and the second glass core substrate 122 are simply illustrated. The first glass core substrate 112 and the second glass core substrate 122 may be as shown in FIG. 6A, and the manufacturing method may refer to FIG. 6B to FIG. 6G.

Figure 7A:
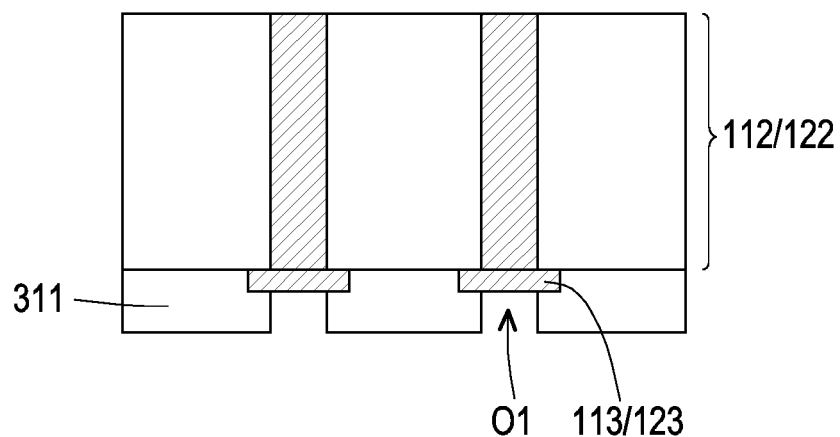
FIG. 7A to FIG. 7B are partial schematic cross-sectional views illustrating a manufacturing method of a semiconductor substrate according to some embodiments of the disclosure.
Figure 7B:
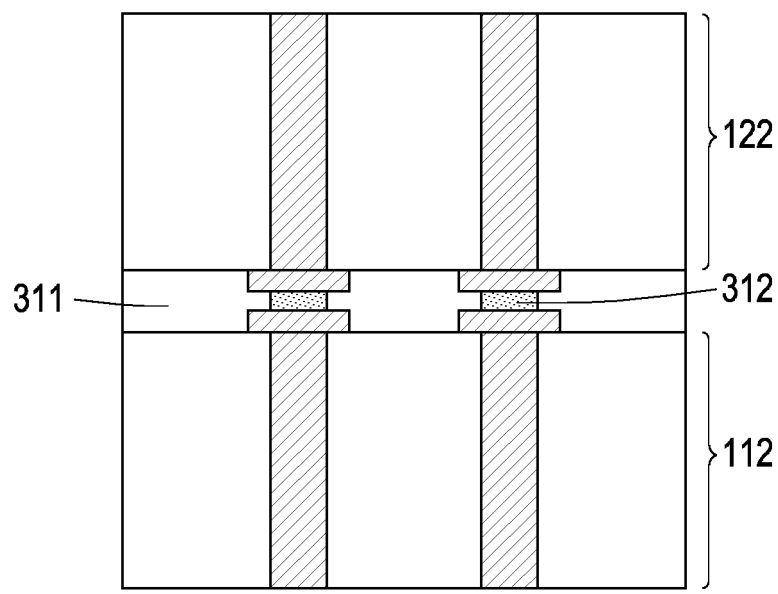

FIG. 7A to FIG. 7B are partial schematic cross-sectional views illustrating a manufacturing method of a semiconductor substrate according to some embodiments of the disclosure.

Referring to FIG. 7A, a two-stage curing material layer 311 with an opening O1 (for example, through a suitable patterning process) is formed on the glass core substrate 112/122, wherein part of the bonding pads 113/123 are exposed by the opening O1. Next, referring to FIG. 7B, a metal adhesion layer 312 (such as copper/silver) is formed in the opening O1, such that the glass core substrate 112 and the glass core substrate 122 are boned with the two-stage curing material layer 311 and the metal adhesion layer 312 to form a semiconductor substrate S7, wherein the bonding pads 113/123 are bonded to each other by the metal adhesion layer 312, and the metal adhesion layer 312 is surrounded by the two-stage curing material layer 311. In here, the metal adhesion layer 312 and the two-stage curing material layer 311 (adhesive material) are constituted to the bonding layer 310, the metal adhesion layer 312 may be called a first portion, and the two-stage curing material layer 311 may be called a second portion. In addition, the two-stage curing material layer 311 may be in a semi-cured state before the metal adhesion layer 312 is formed, and a heating process is performed to form a cured state after after the metal adhesion layer 312 is formed.

In this embodiment, the second portion covers part of the top surface of the bonding pads 113/123, but the disclosure is not limited thereto.

Figure 8A:
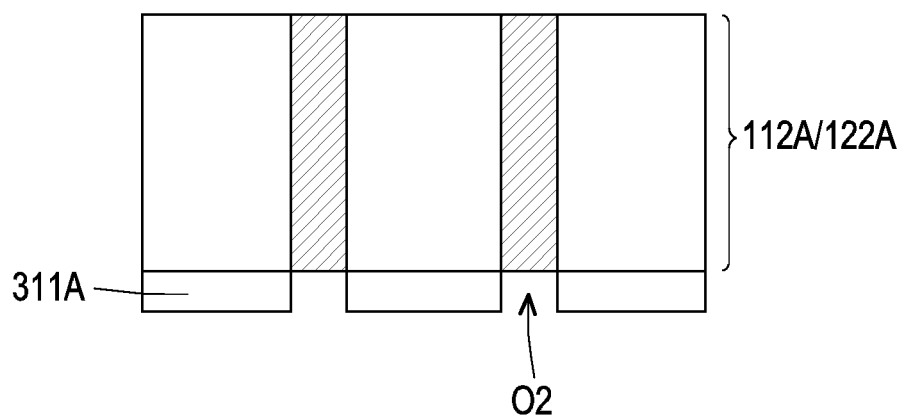
FIG. 8A to FIG. 8B are partial schematic cross-sectional views illustrating a manufacturing method of a semiconductor substrate according to some embodiments of the disclosure.
Figure 8B:
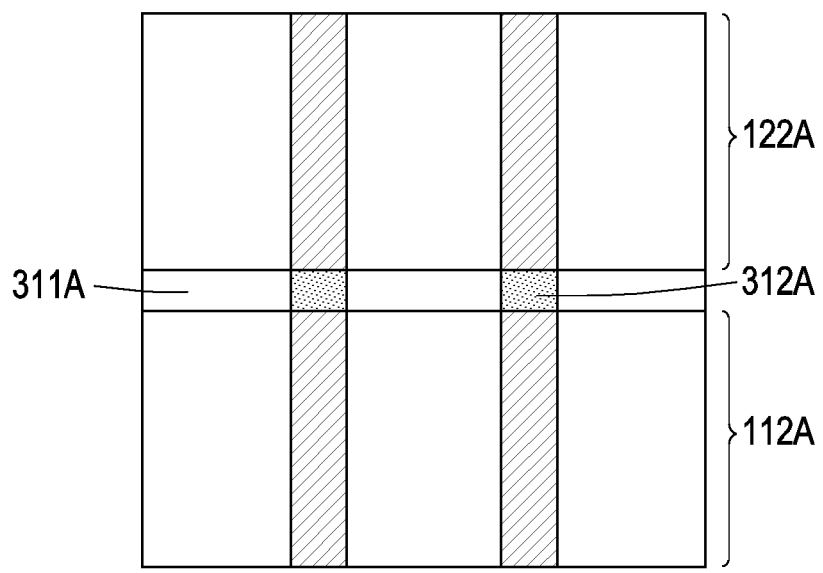

FIG. 8A to FIG. 8B are partial schematic cross-sectional views illustrating a manufacturing method of a semiconductor substrate according to some embodiments of the disclosure.

Referring to FIG. 8A, compared with the glass core substrate 112/122 of FIG. 7A, the glass core substrate 112A/122A of this embodiment does not have the bonding pad, and a two-stage curing material layer 311A is formed thereon with an opening O2 (for example, through a suitable patterning process), wherein the through glass vias of the glass core substrate 112A/122A are exposed by the opening O2. Next, referring to FIG. 8B, a metal adhesion layer 312A is formed in the aforementioned opening O2, such that the glass core substrate 112 and the glass core substrate 122 are bonded to each other through the metal adhesion layer 312A and the two-stage curing material layer 311A to form a semiconductor substrate S8, wherein the through glass vias in the glass core substrate 112A/122A are bonded to each other by the metal adhesion layer 312A, and the metal adhesion layer 312A is surrounded by the two-stage curing material layer 311A. In here, the metal adhesion layer 312A and the two-stage curing material layer 311A are similar to the metal adhesion layer 312 and the two-stage curing material layer 311, which will not be described again.

In this embodiment, the second portion (two-stage curing material layer 311A) is not in direct contact with the through glass vias in the glass core substrate 112A/122A, but the disclosure is not limited thereto.

Figure 9A:
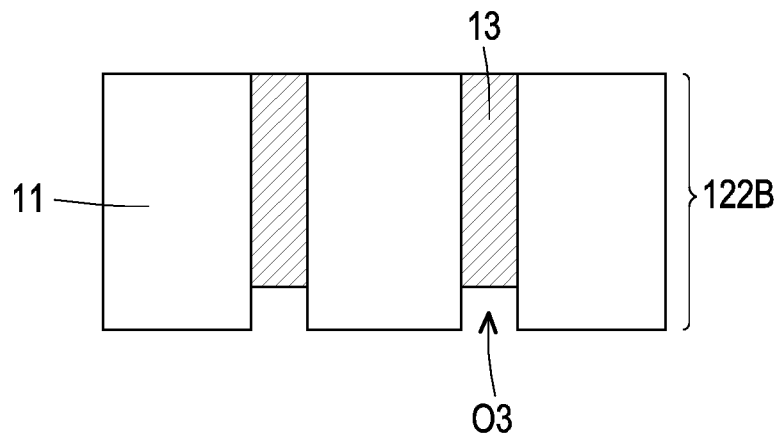
FIG. 9A to FIG. 9C are partial schematic cross-sectional views illustrating a manufacturing method of a semiconductor substrate according to some embodiments of the disclosure.
Figure 9B:
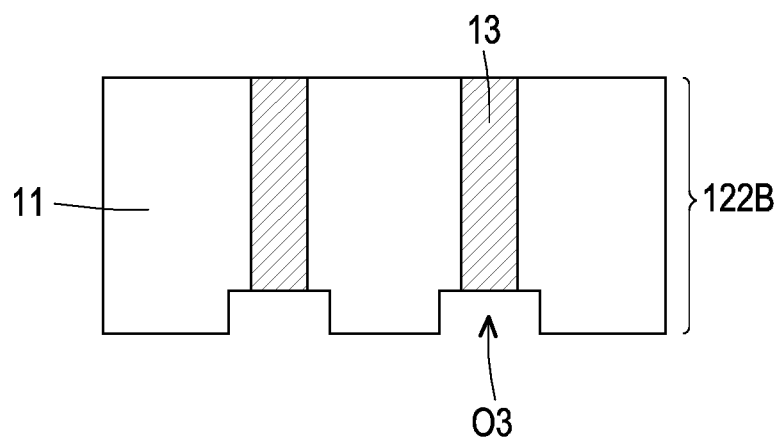
Figure 9C:
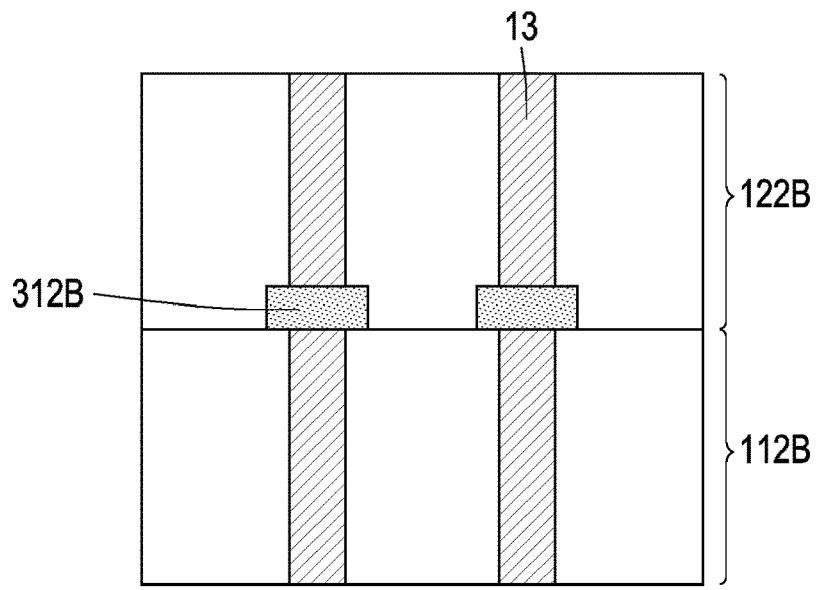

FIG. 9A to FIG. 9C are partial schematic cross-sectional views illustrating a manufacturing method of a semiconductor substrate according to some embodiments of the disclosure.

Referring to FIG. 9A, compared with the second glass core substrate 122A of FIG. 8A, the through glass vias 13 in the second glass core substrate 122B of this embodiment is retracted into the glass substrate 11 through an etching process to form an opening. O3. Next, referring to FIG. 9B, further optionally removing part of the through glass via 13 and part of the glass substrate 11 through an etching process to expand the opening O3. Then, referring to FIG. 9C, a metal adhesion layer 312B is formed in the opening O3, and then the second glass core substrate 122B is bonded and heated to the first glass core substrate 112B through the metal adhesion layer 312B to form a semiconductor substrate S9. In here, although the opening O3 is formed in the second glass core substrate 122B in the figure, however, the opening may also be formed in the first glass core substrate 112B, and then be bonded through similar steps. In addition, in this embodiment, the two-stage curing material layer may be omitted.

Figure 9D:
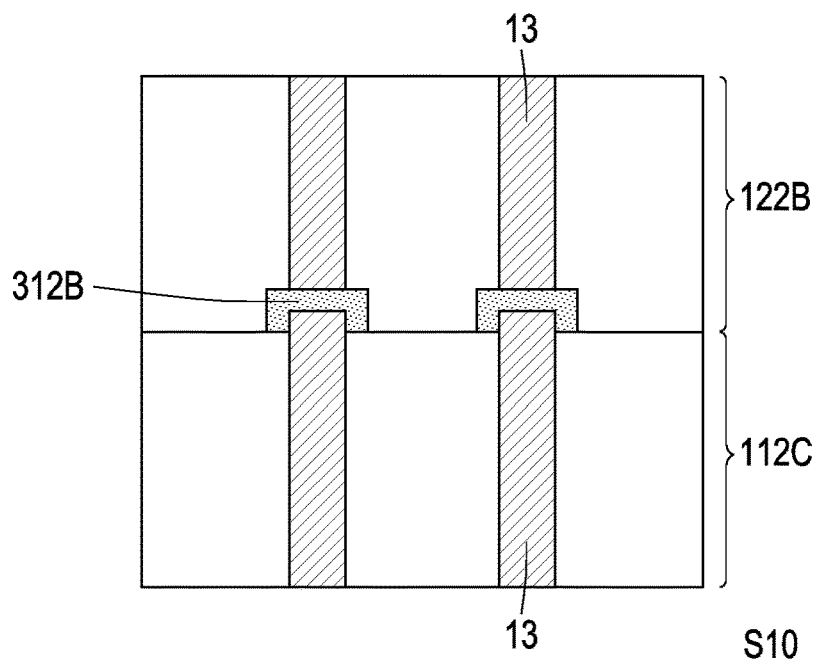
FIG. 9D, FIG. 9E, and FIG. 9F are partial schematic cross-sectional views illustrating an alternative embodiment of FIG. 9C.
Figure 9E:
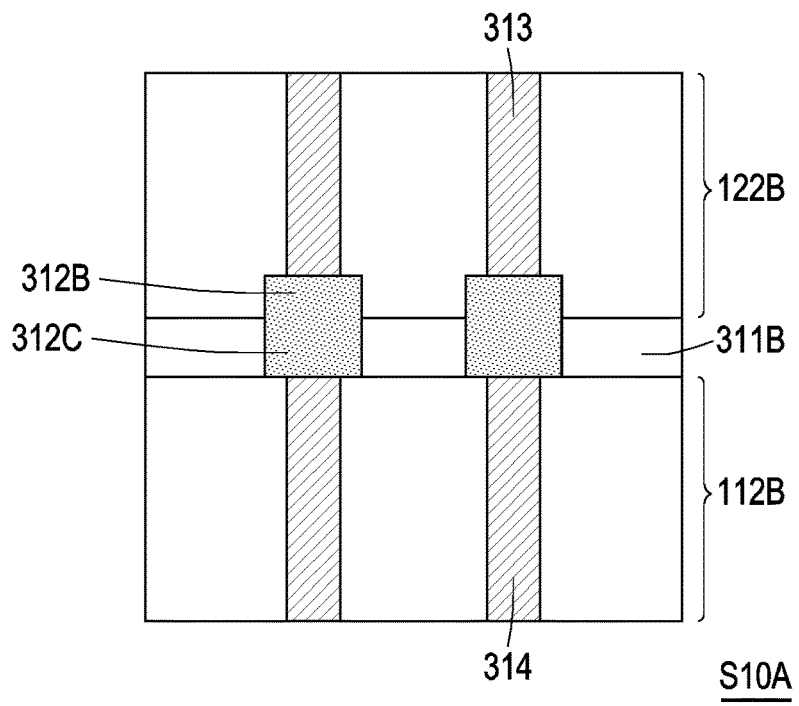
Figure 9F:
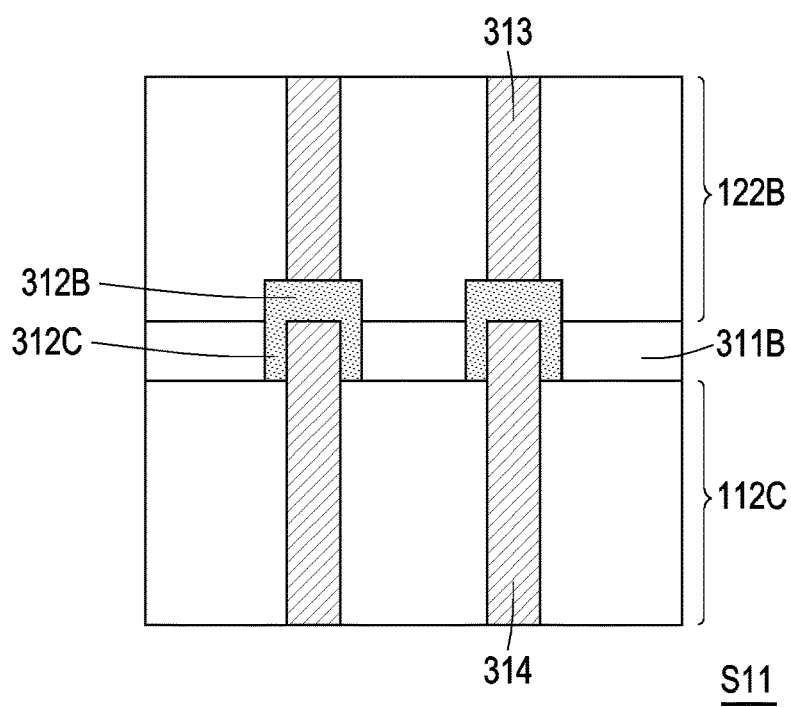
Figure 9G:
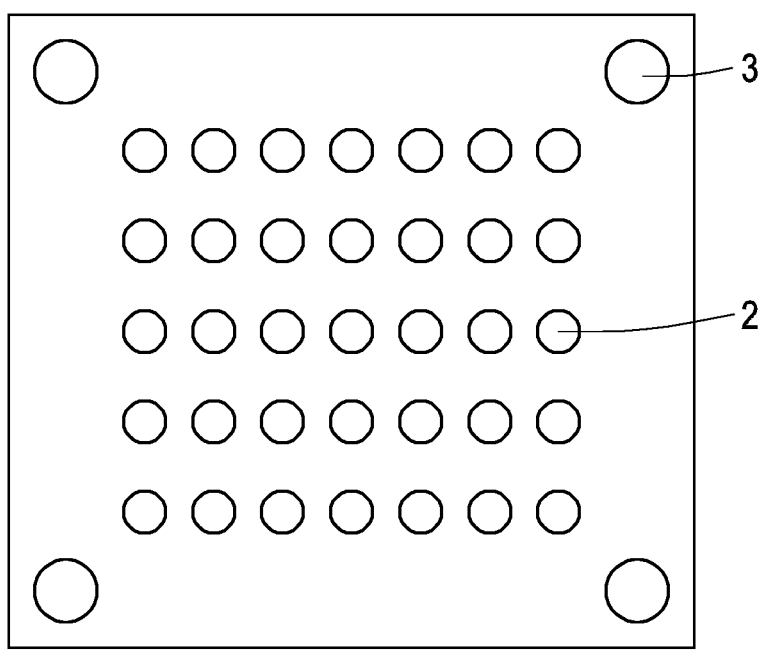
FIG. 9G is a partial schematic top view illustrating FIG. 9D and FIG. 9F.

FIG. 9D, FIG. 9E, and FIG. 9F are partial schematic cross-sectional views illustrating an alternative embodiment of FIG. 9C. FIG. 9G is a partial schematic top view illustrating FIG. 9D and FIG. 9F.

Referring to FIG. 9D, compared with the semiconductor substrate S9 of FIG. 9C, the through glass vias 13 of a first glass core substrate 112C of a semiconductor substrate S10 of this embodiment without the opening extends to the metal adhesion layer 312B (bonding layer) to form a lock and key structure, which may improve bonding reliability.

Referring to FIG. 9E, compared with the semiconductor substrate S9 of FIG. 9C, the semiconductor substrate S10A of this embodiment further includes a metal adhesion layer 312C and a two-stage curing material layer 311B to improve the bonding force, but this disclosure is not limited thereto.

Referring to FIG. 9F, compared with the semiconductor substrate S11 of FIG. 9E, through glass vias 13 of a first glass core substrate 112C of a semiconductor substrate S11 of this embodiment extends to the metal adhesion layer 312C (bonding layer) to form a lock and key structure, which may improve bonding reliability.

Referring to FIG. 9G, in the lock and key structure of FIG. 9D and FIG. 9F, the bonding portion may have a small-sized bonding portion 2 and a large-sized bonding portion 3, and snapping ability may be more effectively lifted by the large-sized bonding portion 3, thereby further enhances the reliability, but the disclosure is not limited thereto. In here, the large-sized bonding portion 3 may be applied to the above various embodiments according to actual design requirements, and the disclosure is not limited.

In the above embodiment when the first circuit structure 110 and the second circuit structure 120 include the glass core substrate and the thin-film circuit, if the coefficient of thermal expansion (CTE) of the second circuit structure 120 is smaller than the CTE of the first circuit structure 110, after high temperature and condensation, the shrinkage of the second circuit structure 120 is small, and the shrinkage of the first circuit structure 110 is large, which will produce warpage situation with a concave (crying face), and the CTE of the glass core substrate will be smaller than the dielectric layer of the thin-film circuit, therefore, when the thin-film circuit is formed on the glass core substrate, it will generate an upward concave (smiley face) force to achieve a balanced function of compensating for the aforementioned warpage situation. In here, the glass core substrate in the first circuit structure 110 and the second circuit structure 120 may have different CTE through suitable thickness or composition design.

It should be noted that although the disclosure only illustrates the bonding of two circuit structures, the disclosure does not limit the number of bonding circuit structures, that is, in accordance with the design rules of the disclosure, three or more circuit structures may be bonded. For example, the connection between the first circuit structure and the second circuit structure may further include a third circuit structure, and the third circuit structure is electrically connected to the first circuit structure and the second circuit structure simultaneously to enhance the flexibility of product use. In addition, the above-disclosed embodiments are only illustrative. Any combination and reasonable extension based on actual design requirements without departing from the spirit and scope of the disclosure should fall within the scope of protection of the disclosure.

Based on the above, in the disclosure, a plurality of circuit structures are first manufactured separately, and then assembles the aforementioned circuit structures into a semiconductor substrate, such that compared with the production for single process sequentially of the semiconductor substrate, the degree of warpage can be effectively reduced, allowing the semiconductor substrate to maintain better yields and improve the electrical performance in subsequent applications while having a multi-layer circuit structure.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A semiconductor substrate, comprising:
   a first circuit structure, comprising a first circuit layer, wherein the first circuit layer comprises a first dielectric layer;
   a second circuit structure comprising a second circuit layer, wherein the second circuit layer comprises a second dielectric layer, the second circuit structure is disposed on the first circuit structure and is electrically connected to the first circuit structure; and
   a surface finish layer disposed on an end of the first circuit structure and/or the second circuit structure to constitute the semiconductor substrate,
   wherein the first circuit structure comprises a first glass core substrate and a first bonding pad, and the second circuit structure comprises a second glass core substrate and a second bonding pad, the first circuit structure further comprises a first thin-film circuit located on the first glass core substrate and located on the opposite side of the first bonding pad, and the second circuit structure further comprises a second thin-film circuit located on the second glass core substrate and located on the opposite side of the first bonding pad, and a coefficient of thermal expansion of the first glass core substrate is different from a coefficient of thermal expansion of the second glass core substrate.

2. The semiconductor substrate according to claim 1, wherein the first circuit structure is a back end of line type, a thin film distribution layers type, a build-up substrate type, or a printed circuit board type, and the second circuit structure is the back end of line type, the thin film distribution layers type, the build-up substrate type, or the printed circuit board type.

3. The semiconductor substrate according to claim 2, wherein the first circuit structure and the second circuit structure are same types or different types.

4. The semiconductor substrate according to claim 2, wherein a thickness of the first dielectric layer in the back end of line type is less than 1 micrometer, a thickness of the first dielectric layer in the thin film distribution layers type ranges from 1 micrometer to 10 micrometers, a thickness of the first dielectric layer in the build-up substrate type ranges from 8 micrometers to 30 micrometers, and a thickness of the first dielectric layer in the printed circuit board type ranges from 15 micrometers to 60 micrometers.

5. The semiconductor substrate according to claim 2, wherein a material of the first dielectric layer in the back end of line type comprises silicon nitride or silicon oxide, a material of the first dielectric layer in the thin film distribution layers type comprises polyimide or benzocyclobutene, a material of the first dielectric layer in the build-up substrate type comprises ABF material or ABF derived material, and a material of the first dielectric layer in the printed circuit board type comprises semi-cured adhesive or bismaleimide triazine.

6. The semiconductor substrate according to claim 1, wherein a warpage direction of the first circuit structure is opposite to a warpage direction of the second circuit structure.

7. The semiconductor substrate according to claim 1, further comprising:
   a permanent carrier arranged on the first circuit structure or the second circuit structure.

8. The semiconductor substrate according to claim 1, wherein a bonding area is between the second circuit structure and the first circuit structure, the first circuit layer further comprises a first conductive via gradually increased in a direction toward the bonding area, the second circuit layer further comprises a second conductive via gradually increased in the direction toward the bonding area.

9. The semiconductor substrate according to claim 1, wherein:
   the first circuit layer comprises a first conductive pattern;
   the second circuit layer comprises a second conductive pattern, wherein:
      the first dielectric layer is not in direct contact with the second dielectric layer adjacent thereof, and the first conductive pattern and the second conductive pattern are electrically connected through solder balls;
      the first dielectric layer is not in direct contact with the second dielectric layer adjacent thereof, and the first conductive pattern and the second conductive pattern are electrically connected through conductive pillars; or
      the first dielectric layer is in direct contact with the second dielectric layer adjacent thereof, and the first conductive pattern is in direct contact with the second conductive pattern adjacent thereof.

10. The semiconductor substrate according to claim 1, further comprising:
    a glass core substrate arranged on the first circuit structure or the second circuit structure.

11. The semiconductor substrate according to claim 10, wherein the glass core substrate is electrically connected to the first circuit structure or the second circuit structure through a plurality of connectors.

12. The semiconductor substrate according to claim 11, further comprising: a first semiconductor component arranged between the adjacent two of the plurality of connectors.

13. The semiconductor substrate according to claim 12, further comprising: a second semiconductor component arranged in the glass core substrate.

14. The semiconductor substrate according to claim 10, wherein there is no connector between the glass core substrate and the first circuit structure or the second circuit structure.

15. The semiconductor substrate according to claim 1 further comprising: a bonding layer arranged between the first circuit structure and the second circuit structure.

16. The semiconductor substrate according to claim 15, wherein the bonding layer is an underfill, and the underfill fills a gap between the first bonding pad and the second bonding pad.

17. The semiconductor substrate according to claim 15, wherein the bonding layer is an adhesive material, and the adhesive material comprises a first portion bonding the first bonding pad and the second bonding pad, and a second portion surrounding the first portion.

18. The semiconductor substrate according to claim 17, wherein the first portion is a metal adhesion layer, and the second portion is a two-stage curing material layer.

19. The semiconductor substrate according to claim 17, wherein the second portion covers a portion of a top surface of the first bonding pad and the second bonding pad.

20. The semiconductor substrate according to claim 1, the first glass core substrate is bonded to the second glass substrate through a bonding layer.

21. The semiconductor substrate according to claim 20, wherein the bonding layer is an adhesive material, and the adhesive material comprises a first portion bonding to a through glass via in the first glass core substrate and a through glass via in the second glass core substrate.

22. The semiconductor substrate according to claim 21, wherein the adhesive material further comprises a second portion surrounding the first portion.

23. The semiconductor substrate according to claim 22, wherein the first portion is a metal adhesion layer, and the second portion is a two-stage curing material layer.

24. The semiconductor substrate according to claim 22, wherein the second portion is not direct contact with the through glass via in the first glass core substrate and the through glass via in the second glass core substrate.

25. The semiconductor substrate according to claim 21, wherein the first portion is embedded in one of the first glass core substrate or the second glass core substrate.

26. The semiconductor substrate according to claim 22, wherein the through glass via of the other one of the first glass core substrate or the second glass core substrate extends to the bonding layer.

27. An electronic package, comprising:
   the semiconductor substrate according to claim 1; and
   at least one chip arranged on the surface finish layer of the semiconductor substrate.

* * * * *